United States Patent
Hidaka et al.

(10) Patent No.: US 10,521,533 B2
(45) Date of Patent: *Dec. 31, 2019

(54) INDUCTOR SIMULATION METHOD AND INDUCTOR NONLINEAR EQUIVALENT CIRCUIT MODEL

(71) Applicant: MURATA MANUFACTURING CO., LTD., Kyoto-fu (JP)

(72) Inventors: Seiji Hidaka, Kyoto-fu (JP); Ko Yamanaga, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 178 days.

This patent is subject to a terminal disclaimer.

(21) Appl. No.: 14/936,060

(22) Filed: Nov. 9, 2015

(65) Prior Publication Data

US 2016/0070837 A1    Mar. 10, 2016

Related U.S. Application Data

(63) Continuation of application No. PCT/JP2014/062157, filed on May 2, 2014.

(30) Foreign Application Priority Data

May 14, 2013 (JP) .................................. 2013-102542

(51) Int. Cl.
   G06F 17/50    (2006.01)
   G06F 17/10    (2006.01)
(52) U.S. Cl.
   CPC .......... *G06F 17/5036* (2013.01); *G06F 17/10* (2013.01)
(58) Field of Classification Search
   CPC ........................ G06F 17/5036; G06F 17/10
   (Continued)

(56) References Cited

U.S. PATENT DOCUMENTS 4,485,356 A * 11/1984 Fassino ............... H03B 5/20
                                                331/132
4,885,528 A * 12/1989 Tanaka ................ G01R 27/00
                                                324/713

(Continued)

FOREIGN PATENT DOCUMENTS

| JP | H02-128573 U | 10/1990 |
| JP | 2002-259482 A | 9/2002 |

(Continued)

OTHER PUBLICATIONS

Lee et al. ("Choosing Inductors for DC/DC Regulators", Issue 6 2011 Power Electronics Europe, pp. 28-31).*

(Continued)

*Primary Examiner* — Kamini S Shah
*Assistant Examiner* — Iftekhar A Khan
(74) *Attorney, Agent, or Firm* — Studebaker & Brackett PC

(57) ABSTRACT

An inductor simulation method and nonlinear equivalent circuit model enabling dynamic simulation of nonlinear characteristics when a direct current is superimposed with high precision. An equivalent circuit of an inductor is represented using a series circuit of passive circuit elements. Characteristic change ratios of the passive circuit elements when a direct current is superimposed are expressed as an approximate function on the basis of actually measured values. A reference current measured by each of voltage source models is referred to by a control voltage source connected in series to the passive circuit elements. The characteristic change ratios are calculated in accordance with the reference current Iref. Difference voltages are generated on the basis of the characteristic change ratios and voltages occurring when no direct current is superimposed, they are superimposed on the voltages $V_{L1}$ and $V_{R1}$ occur- (Continued)

ring when no direct current is superimposed, thereby simulating the nonlinear characteristics.

17 Claims, 17 Drawing Sheets

(58) Field of Classification Search
USPC .............................................................. 703/2
See application file for complete search history.

(56) References Cited

U.S. PATENT DOCUMENTS

| | | | | |
|---|---|---|---|---|
| 5,343,177 | A * | 8/1994 | Williams | H03H 11/0416 333/213 |
| 6,064,808 | A * | 5/2000 | Kapur | G06F 17/5018 703/1 |
| 6,114,938 | A * | 9/2000 | Iida | H01F 17/0006 336/200 |
| 6,324,493 | B1 * | 11/2001 | Belk | G06F 17/5018 703/13 |
| 8,610,311 | B1 * | 12/2013 | Grimes | H01F 30/06 307/104 |
| 8,723,508 | B2 * | 5/2014 | Tachibana | G06F 17/5018 324/207.15 |
| 2001/0028292 | A1 * | 10/2001 | Iida | H01F 21/12 336/200 |
| 2002/0017893 | A1 * | 2/2002 | Duff, Jr. | H01G 9/155 320/100 |
| 2005/0184357 | A1 * | 8/2005 | Chiba | H01L 27/0641 257/531 |
| 2005/0251378 | A1 * | 11/2005 | Zhao | G06F 17/5036 703/14 |
| 2006/0217948 | A1 * | 9/2006 | Humphrey | G06F 17/5036 703/14 |
| 2006/0235672 | A1 * | 10/2006 | Ruehli | G06F 17/5036 703/14 |
| 2008/0038562 | A1 * | 2/2008 | Ito | B32B 27/30 428/411.1 |
| 2010/0277259 | A1 * | 11/2010 | Ahn | H01P 1/20381 333/204 |
| 2011/0050191 | A1 * | 3/2011 | Tsuji | H01F 17/0006 323/282 |
| 2011/0181274 | A1 * | 7/2011 | Tachibana | G06F 17/5018 324/207.15 |
| 2011/0230943 | A1 * | 9/2011 | Johnson | A61N 1/05 607/116 |
| 2011/0270598 | A1 * | 11/2011 | Zou | G06F 17/5036 703/14 |
| 2012/0274243 | A1 * | 11/2012 | Sumioka | H04N 5/2171 318/116 |
| 2013/0154784 | A1 * | 6/2013 | Hachiya | H01F 5/003 336/200 |
| 2013/0245413 | A1 * | 9/2013 | Dabney | A61N 1/08 600/373 |
| 2014/0019926 | A1 * | 1/2014 | Miyashita | G06F 17/5009 716/107 |
| 2014/0021825 | A1 * | 1/2014 | Ocalan | H02N 11/002 310/300 |
| 2014/0097923 | A1 * | 4/2014 | Naito | H01F 17/0033 336/83 |

FOREIGN PATENT DOCUMENTS

| | | |
|---|---|---|
| JP | 2003-122810 A | 4/2003 |
| JP | 2007-207168 A | 8/2007 |
| JP | 2010-204869 A | 9/2010 |
| JP | 2015-150579 A | 8/2015 |
| WO | 20101038799 A1 | 4/2010 |

OTHER PUBLICATIONS

Jonathan H. B. Deane ("Modeling the Dynamics of Nonlinear Inductor Circuits", IEEE Transactions on Magnetics. vol. 30, No. 5, Sep. 1994, pp. 2795-2801).*
Salas et al. ("Equivalent Electrical Model of a Ferrite Core Inductor Excited by a Square Waveform Including Saturation and Power Losses for Circuit Simulation", IEEE, 2013, pp. 4257-4260) (Year: 2013).*
P. R. K. Chetty ("Current Injected Equivalent Circuit Approach to Modeling of Switching DC-DC Converters in Discontinuous Inductor Conduction Mode", IEEE, 1982, pp. 230-234) (Year: 1982).*
Rozanov et al. ("Analysis of current-controlled inductors by new SPICE behavioral model", HAIT Journal of Science and Engineering, 2005, pp. 558-570) (Year: 2005).*
Written Opinion of the International Searching Authority, PCT/JP2014/062157, dated Aug. 5, 2014.

* cited by examiner

EQUIVALENT

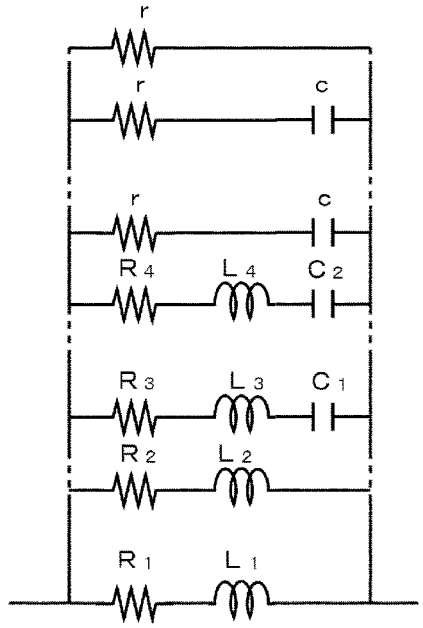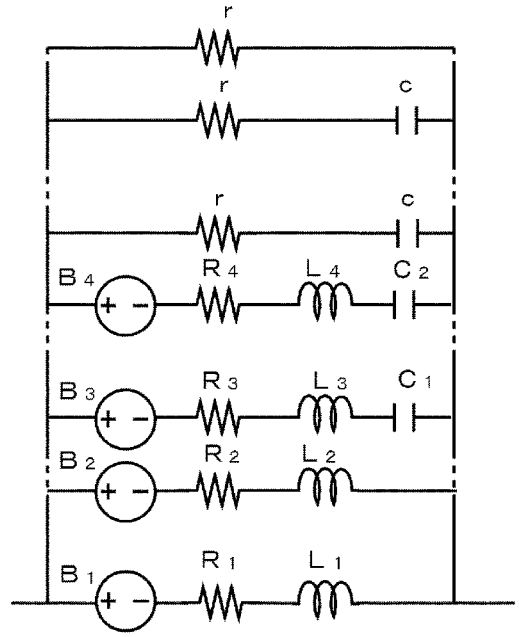

INDUCTOR SIMULATION METHOD AND INDUCTOR NONLINEAR EQUIVALENT CIRCUIT MODEL

CROSS REFERENCE TO RELATED APPLICATIONS

This application claims benefit of priority to Japanese Patent Application 2013-102542 filed May 14, 2013, and to International Patent Application No. PCT/JP2014/062157 filed May 2, 2014, the entire content of which is incorporated herein by reference.

TECHNICAL FIELD

The present disclosure relates to an inductor simulation method of simulating nonlinear characteristics of inductors when a direct current is superimposed and an inductor nonlinear equivalent circuit model is used in the simulation.

BACKGROUND

Simulation methods and equivalent circuit models for electronic components of this kind are used in circuit simulations in electronic circuit design. The circuit simulations employ circuit simulators, such as a simulation program with integrated circuit emphasis (SPICE). Some circuit simulators can be used at websites of producers of electronic components. A user can access a website of a producer of electronic components from a terminal, such as a personal computer, over the Internet network and use the circuit simulator.

One example of the simulation methods and equivalent circuit models of this type is the one for capacitors disclosed in Japanese Unexamined Patent Application Publication No. 2002-259482.

In this simulation, as illustrated in FIG. 1 in Japanese Unexamined Patent Application Publication No. 2002-259482, given capacitor frequency characteristics of a capacitor are input in a first step, one of an RC circuit, RL circuit, and RCL circuit is formed as an equivalent circuit model representing a circuit enabling simulation in a time domain using frequency-independent resistances (R), capacitances (C), and/or inductances (L) in a second step, an evaluation function for evaluating accuracy of the equivalent circuit model formed in the second step is composed in a third step, and the evaluation function composed in the third step is minimized and thus a circuit constant is determined in a fourth step.

In Japanese Unexamined Patent Application Publication No. 2002-259482, with the above-described configuration, the equivalent circuit model enabling simulation in a time domain for a capacitor with an impedance indicated in a frequency domain is derived, and the electric characteristics of the capacitor in the frequency domain or time domain are estimated by circuit simulation.

One example of known inductor simulation methods and equivalent circuit models is disclosed in Japanese Unexamined Patent Application Publication No. 2010-204869.

As illustrated in FIG. 1(C) in Japanese Unexamined Patent Application Publication No. 2010-204869, this simulation uses an equivalent circuit model in which a series circuit of an inductance L1 and a resistance R1 for skin effect of an internal conductor is connected in parallel to a mutual inductance Lm between a direct-current inductance L0 and the inductance L1 and that parallel circuit is connected in series to the direct-current inductance L0 and a direct-current resistance Rdc1 of the internal conductor. In this equivalent circuit model, an inductance and a resistance of an outer electrode are considered at the same time, the inductance L0 is connected in series to an inductance Ls of the outer electrode, and the direct-current resistance Rdc1 of the inner conductor is connected in series to a direct-current resistance Rdc2 of the outer electrode. A series circuit of a parasitic capacitance Cp of a dielectric constituting a chip in a multilayer chip inductor and a resistance Rp representing a dielectric loss is connected in parallel to the inner sides of the equivalent elements Ls and Rdc2 of the outer electrode.

In Japanese Unexamined Patent Application Publication No. 2010-204869, errors occurring between circuit performance in circuit design and a real one are suppressed by a circuit simulation using the above-described equivalent circuit model.

One example of known capacitor simulation methods and equivalent circuit models is a technique disclosed in Japanese Unexamined Patent Application Publication No. 2012-150579. This technique employs an idealized C circuit model and a wide-band high-precision equivalent circuit model.

As illustrated in FIG. 1(A) in Japanese Unexamined Patent Application Publication No. 2012-150579, the idealized C circuit model is represented by an equivalent circuit including a single capacitive element C as a circuit element. A voltage v applied across the capacitive element C is expressed by the following expression (1).

$$v = v_{ac} + V_{dc} \tag{1}$$

where $v_{ac}$ denotes a time-varying signal voltage and a noise voltage and $V_{dc}$ denotes DC bias voltage applied across the capacitive element C.

The characteristics in which the capacitive element C is changed by the DC bias voltage $V_{dc}$ are expressed by the following polynomial expression (2).

$$\begin{aligned} C &= C(V_{dc}) \\ &= C_0 + C_1 V_{dc} + C_2 V_{dc}^2 + C_3 V_{dc}^3 + C_4 V_{dc}^4 + C_5 V_{dc}^5 + \\ &\quad C_6 V_{dc}^6 + \dots \end{aligned} \tag{2}$$

A current i flowing through the capacitive element C is expressed by the following expression (3).

$$i = C(V_{dc}) \cdot dv/dt \tag{3}$$

To calculate Expression (3), as illustrated in FIG. 1(B) in Japanese Unexamined Patent Application Publication No. 2012-150579, an operation circuit is established. In this operation circuit, the capacitive element C is converted into a nonlinear voltage control voltage source UA3 controlled by the DC bias voltage $V_{dc}$. The total voltage v applied across the capacitor passes through low pass filters L1 and R1 each having a significantly low cutoff frequency via a linear voltage control voltage source E1. The DC bias voltage $V_{dc}$ is thus obtained, and it is provided to the nonlinear voltage control voltage source UA3. The total voltage v is supplied to the input terminal of a differentiator UA1 via a linear voltage control voltage source E2, and thus differentiation dv/dt is performed. An output voltage v1 of the differentiator UA1 is input into a three-terminal multiplier UA2, together with an output voltage ($C(V_{dc})$) of the nonlinear voltage control voltage source UA3, which is a substitute for the capacitive element C, and thus multiplication ($C(V_{dc}) \cdot dv/dt$) is performed. In this manner, a result of the multiplication is output to an output terminal of the multiplier UA2. Because an output voltage v2 of the multiplier UA2 is equal to the product of the current i flowing through the capacitor and a unit resistance, it is replaced with the capacitor using a linear voltage control current source G controlled by the output voltage v2.

Such an idealized C circuit model is not suited for circuit simulation because a difference from the impedance characteristics of an actual component, in particular, difference in a high-frequency band is too large, but it is useful for an early stage in circuit design or prediction of circuit characteristics.

The wide-band high-precision equivalent circuit model disclosed in Japanese Unexamined Patent Application Publication No. 2012-150579 is applied to a simulation of a multilayer ceramic capacitor (MLCC). This simulation uses the equivalent circuit model having the circuit configuration illustrated in FIG. 5(A) in Japanese Unexamined Patent Application Publication No. 2012-150579. As illustrated in FIG. 5(B) in Japanese Unexamined Patent Application Publication No. 2012-150579, in a multilayer chip capacitor 10, a plurality of internal electrodes are stacked, and electrodes are extended out therefrom in opposite directions in an alternating manner. The equivalent circuit illustrated in FIG. 5(A) in Japanese Unexamined Patent Application Publication No. 2012-150579 takes the thickness of each of the plurality of internal electrodes 20 of the multilayer chip capacitor 10 into consideration. In addition to the electromagnetic effect in an upper surface 22 and a lower surface 24 in each of the plurality of internal electrodes 20, the electromagnetic effect in a first side surface 26 and a second side surface 28 and an open end surface 30 of the plurality of internal electrodes 20 are considered.

All values of various circuit elements in this equivalent circuit are changed by a DC bias voltage. The changes in characteristics of each of the circuit elements caused by the DC bias voltage are expressed by a polynomial expression, and the equivalent circuit model of the MLCC when these changes in characteristics are considered is illustrated in FIG. 12. This model employs a differentiator, multiplier, three-terminal and four-terminal adders and also uses a divider and five-terminal adder. Such a wide-band high-precision model that considers the changes in characteristics caused by the DC bias voltage can achieve good simulation precision in a wide frequency band.

SUMMARY

Technical Problem

Characteristic values of electronic components, for example, electrostatic capacities of capacitors or inductances of inductors, change with applied superimposed DC bias voltages or direct currents, and the changes are not negligible in circuit simulation. However, each of the equivalent circuit models used in the known simulation methods for electronic components disclosed in Japanese Unexamined Patent Application Publication No. 2002-259482 and Japanese Unexamined Patent Application Publication No. 2010-204869 is made of a combination of only passive circuit elements of a resistive element R, inductive element L, and capacitive element C, and do not reflect changes in characteristics occurring in the electronic component when the superimposed DC bias voltage or direct current is applied.

In the known simulation method for an electronic component disposed in Japanese Unexamined Patent Application Publication No. 2012-150579, the use of a voltage source model or current source model in the equivalent circuit model enables the changes in characteristics occurring in the electronic component when the superimposed DC bias voltage is applied to be reflected in a simulation. However, this equivalent circuit model has a complex configuration including operation circuits for differentiation, multiplication, addition, and the like. Thus the equivalent circuit model cannot be derived regularly under a certain rule, and the action of driving the equivalent circuit model is very difficult. Because of this complex configuration, it is also difficult to estimate circuit operations, and the circuit is not transparent. In addition, because the approximate expression reflecting the dependence of the direct-current bias includes terms with odd number exponents, as indicated in Expression (2), cases where the direct-current bias has an inversed sign are not supported, and the model has a polarity problem. If the value of the direct-current bias changes suddenly, a problem arises in that the value is converted into a divergent value.

Solution to Problem

The present disclosure is made to solve the above problems, and provides an inductor simulation method for simulating nonlinear characteristics of an inductor. The inductor simulation method includes:
representing an equivalent circuit of the inductor by using a passive circuit element;
expressing a characteristic change ratio of the passive circuit element when a direct current is superimposed as an approximate function that uses a current as a variable, based on actually measured values; and
referring to the current flowing in the inductor, generating a difference voltage between a voltage occurring in the passive circuit element when the direct current is superimposed and a voltage occurring in the passive circuit element when no direct current is superimposed, based on the characteristic change ratio calculated by using the approximate function in accordance with the referred current and based on the voltage occurring when no direct current is superimposed, by using a control voltage source connected in series to the passive circuit element whose characteristics are changed by the superimposition of the direct current, and superimposing the difference voltage on the voltage occurring when no direct current is superimposed, thereby simulating the nonlinear characteristics of the inductor when the direct current is superimposed.

The present disclosure also provides an inductor nonlinear equivalent circuit model including:
a passive circuit element that represents an equivalent circuit of an inductor;
current referring element configured to refer to a current flowing in the inductor; and
a control voltage source configured to generate a difference voltage between a voltage occurring in the passive circuit element when a direct current is superimposed and a voltage occurring in the passive circuit element when no direct current is superimposed, based on a characteristic change ratio calculated in accordance with the current referred to by the current referring element and by using an approximate function that expresses, based on actually measured values, the characteristic change ratio of the passive circuit element when the direct current is superimposed and that uses a current as a variable, and based on the voltage occurring when no direct current is superimposed, the control voltage source being connected in series to the passive circuit element whose characteristics are changed by the superimposition of the direct current.

In the inductor simulation method and inductor nonlinear equivalent circuit model in the present configuration, the characteristic change ratio of the passive circuit element when the direct current is superimposed is expressed as the approximate function using the referred current as the variable, based on the actually measured values. Accordingly, the characteristic change ratio of the passive circuit element is calculated by using the approximate function in accordance with the referred current. The voltage occurring in the passive circuit element when the direct current is superimposed can be determined by superimposing the difference voltage between the voltage occurring when the direct current is superimposed and the voltage occurring when no direct current is superimposed on the voltage occurring in the passive circuit element when no direct current is superimposed. Thus the difference voltage between the voltage occurring when the direct current is superimposed and the voltage occurring when no direct current is superimposed is generated by the control voltage source, based on the above-mentioned characteristic change ratio and the voltage occurring when no direct current is superimposed, the control voltage source is connected in series to the passive circuit element, the difference voltage is superimposed on the voltage occurring when no direct current is superimposed, thus enabling simulation of the voltage occurring in the passive circuit element when the direct current is superimposed.

More specifically, the characteristic change ratio of the passive circuit element is calculated by using the approximate function, and the difference voltage is generated based on the characteristic change ratio and the voltage occurring when no direct current is superimposed by the control voltage source, thus implementing the simulation capable of performing dynamic tracking for any superimposed direct current. It is thus possible to provide, with a simple configuration and without difficulty, an inductor simulation method and inductor nonlinear equivalent circuit model capable of precisely and dynamically simulating nonlinear characteristics of the inductor when the direct current is superimposed. The inductor nonlinear equivalent circuit model can be obtained by using as a reference the voltage occurring when no direct current is superimposed, by simply superimposing the difference voltage on the voltage occurring when no direct current is superimposed by the control voltage source, as described above. Thus, conversely, by removing the control voltage source from the equivalent circuit model, the inductor equivalent circuit model corresponding to the voltage occurring when no direct current is superimposed, that is, in the case where no direct current is superimposed, can be obtained easily.

In the present disclosure, the difference voltage may be given as a function form of the following expression:

$$\Delta V = V_0 \times (\exp(f(x)) - 1)$$

where the difference voltage is $\Delta V$, the voltage occurring when no direct current is superimposed is $V_0$, and the approximate function is the function $\exp(f(x))$ using the referred current x as a variable.

With this configuration, when the value of the referred current x is zero, the value of the function $\exp(f(x))$, which is an exponential function, is one, the value of the coefficient $(\exp(f(x))-1)$, which is multiplied to the voltage $V_0$ occurring when no direct current is superimposed, is zero, and the value of the difference voltage $\Delta V$ is also zero. When the value of the referred current x is not zero, the value of the function $\exp(f(x))$ is larger than one, and the value of the coefficient $(\exp(f(x))-1)$, which is multiplied to the voltage $V_0$ occurring when no direct current is superimposed, is larger than zero. Thus, the value of the difference voltage $\Delta V$ is calculated so as to correspond to the state of actual use. When the value of the referred current x is not zero, the difference voltage $\Delta V$ is calculated in accordance with the current x on all occasions, whereby the characteristics of the inductor are simulated, and the results are utilized for qualitative understanding of the inductor.

In the present disclosure, the approximate function may be given by an even function in a polynomial form that includes no odd number exponents.

With this configuration, because the approximate function is expressed as the polynomial form including no odd number exponents, the characteristic change ratio in the passive circuit element can be appropriately approximated by the approximate function even when the sign of the direct-current bias is inversed or even when the value of the direct-current bias changes suddenly, unlike known inductor simulations.

In the present disclosure, the current flowing in the inductor may be referred to at an input terminal or at an output terminal of the equivalent circuit, and the voltage occurring when no direct current is superimposed may be referred to at both terminals of the passive circuit element.

With this configuration, unlike a method of performing calculation by setting the reference current or the voltage occurring when no direct current is superimposed separately from the equivalent circuit model, the calculation of the difference voltage is performed by making reference to an instantaneous current occurring at the input terminal or output terminal in the equivalent circuit model or an instantaneous voltage occurring across the passive circuit element in the equivalent circuit model. Thus, the current and the voltage occurring when no direct current is superimposed which are to be used in the calculation of the difference voltage can be referred to without time lags, and transient response analysis for nonlinearity of the inductor can be made at high speed and with high precision.

In the present disclosure, the passive circuit element connected in series to the control voltage source may be a single inductive element, or a series circuit of an inductive element and a resistive element, or a series circuit of an inductive element, a resistive element, and a capacitive element.

With this configuration, the characteristics of the passive circuit element when no direct current is superimposed are represented by the single inductive element, or the series circuit of the inductive element and the resistive element, or the series circuit of the inductive element, the resistive element, and the capacitive element. By connecting the control voltage source in series to the circuit, the characteristics of the passive circuit element when the direct current is superimposed are simulated.

In the present disclosure, a plurality of series circuits, each constituted by the control voltage source and the passive circuit element, may form a parallel circuit.

With this configuration, the simple series circuits having the control voltage sources and the passive circuit elements are connected in parallel, and an increased number of parallel connections can enhance the accuracy of simulation of the equivalent circuit model. Thus, the equivalent circuit model with high accuracy of simulation can be configured in a regular and transparent manner. Because the plurality of series circuits of the control voltage sources and the passive circuit elements are simply connected in parallel, the characteristics of the passive circuit element when the direct current is superimposed can be simulated by a systematic calculation procedure.

In the present disclosure, the equivalent circuit may include the passive circuit element whose characteristics are not changed by the superimposition of the direct current to the inductor.

With this configuration, because the equivalent circuit model includes combination of the passive circuit element whose characteristics are changed by the superimposition of the direct current and the passive circuit element whose characteristics are not changed by the superimposition of the direct current, the precision of the simulation of the nonlinear characteristics of the inductor can be further enhanced, and the frequency band of the simulation can be widened.

The present disclosure provides a computer program for implementing the inductor simulation method of any one of the configurations described above or for enabling the inductor nonlinear equivalent circuit model of any one of the configurations described above to function. The computer program includes:

a first step of inputting a type of the inductor;
a second step of inputting a voltage to be applied to the inductor or a current to be flowed to the inductor; and
a third step of making reference to the current flowing in the inductor in accordance with the voltage or the current input in the second step, generating the difference voltage by the control voltage source, based on the characteristic change ratio calculated by using the approximate function prepared in advance for the inductor of the type input in the first step in accordance with the referred current and based on the voltage occurring when no direct current is superimposed, superimposing the difference voltage on the voltage occurring when no direct current is superimposed, thereby simulating the nonlinear characteristics of the inductor when the direct current is superimposed.

With this configuration, inputting the type of the inductor to be simulated and the value of the voltage to be applied to the inductor or the current to be flowed to the inductor into the computer program enables the computer program to superimpose the difference voltage on the voltage occurring when no direct current is superimposed of the passive circuit element and to automatically perform simulation of the nonlinear characteristics of the inductor of the type input. Thus, a user of this simulation method or nonlinear equivalent circuit model can perform accurate circuit simulation with high precision easily by simply inputting the type of the inductor to be simulated and the voltage to be applied to the inductor or the current to be flowed to the inductor into the computer program. As a result, even an ordinary user who does not have expert knowledge of circuit simulation can perform accurate circuit simulation for electronic circuits using the inductor with high precision easily.

The present disclosure provides a method of using the computer program by accessing a server having the computer program over the Internet network and using the computer program from a terminal connected to the Internet network.

With this configuration, a user can readily use the above-described computer program by accessing a server having the above-described computer program from a terminal connected to the Internet network. Thus, the inductor simulation method and inductor nonlinear equivalent circuit model according to the present disclosure can be provided to many users.

Advantageous Effects of Disclosure

According to the present disclosure, as described above, the inductor simulation method and inductor nonlinear equivalent circuit model enabling dynamic simulation of nonlinear characteristics of the inductor when the direct current is superimposed with high precision can be easily provided using a simple configuration.

BRIEF DESCRIPTION OF DRAWINGS

FIGS. 7(a), 7(b), and 7(c) illustrate configurations of passive circuit elements representing characteristics when the direct current Idc is not superimposed and being used in the passive equivalent circuit model in each embodiment of the present disclosure and FIGS. 7(d), 7(e), and 7(f) illustrate configurations of passive circuit elements representing nonlinear characteristics when the direct current Idc is superimposed and being used in the nonlinear equivalent circuit model in each embodiment.

FIG. 8(a) is a circuit diagram that illustrates an admittance-developed passive equivalent circuit model including passive circuit elements r and c whose characteristics are not changed by superimposition of the direct current Idc to inductors and FIG. 8(b) is a circuit diagram that illustrates an admittance-developed nonlinear equivalent circuit model including these passive circuit elements r and c.

DETAILED DESCRIPTION

Embodiments applied to LTspice supplied from Linear Technology Corporation of an inductor simulation method and inductor nonlinear equivalent circuit model according to the present disclosure are described below.

Figure 1:
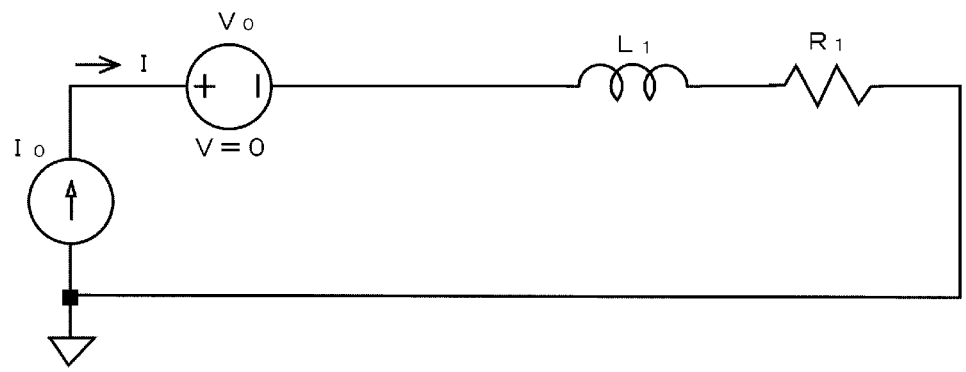
FIG. 1($a$) is a circuit diagram that illustrates an inductor passive equivalent circuit model when no direct current is superimposed in a first embodiment of the present disclosure and FIG. 1($b$) is a circuit diagram that illustrates an inductor nonlinear equivalent circuit model when a direct current is superimposed in the first embodiment.
Figure 1:
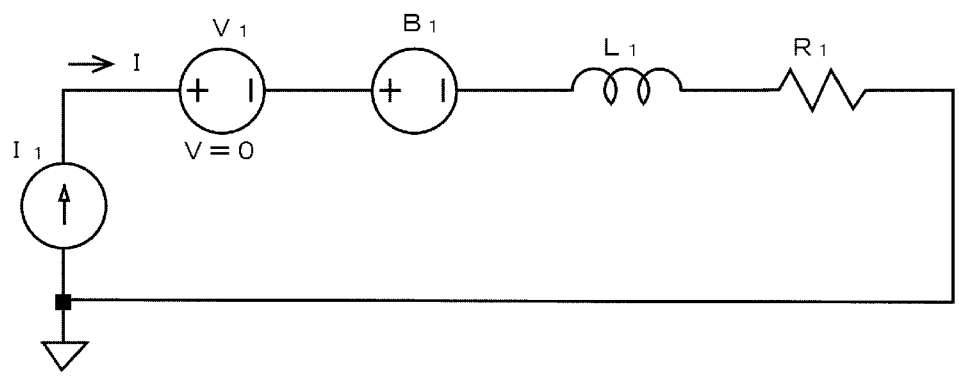

FIG. 1(a) is a circuit diagram that illustrates an inductor passive equivalent circuit model when no direct current is superimposed in a first embodiment. FIG. 1(b) is a circuit diagram that illustrates an inductor nonlinear equivalent circuit model when the direct current is superimposed in the first embodiment.

A series circuit of an inductor element $L_1$ and a resistive element $R_1$ in each equivalent circuit model constitutes a passive circuit element representing an equivalent circuit of the inductor being a target for simulation. In the passive equivalent circuit model illustrated in FIG. 1(a), an alternating current Iac on which a direct current Idc is not superimposed is flowed into the passive circuit elements L1 and $R_1$ as a current I by a current source model $I_0$ of LTspice. In the nonlinear equivalent circuit model illustrated in FIG. 1(b), the alternating current Iac on which the direct current Idc is superimposed is flowed into passive circuit elements $L_1$ and $R_1$ as the current I by a current source model $I_1$ of LTspice. Here, the circuit constant of the inductive element $L_1$ in each equivalent circuit is set to 5 μH, the circuit constant of the resistive element $R_1$ is set to 0.2Ω, and the superimposed direct current Idc is set to 1 A.

A voltage source model $V_0$ in the passive equivalent circuit model illustrated in FIG. 1(a) and a voltage source model $V_1$ in the nonlinear equivalent circuit model illustrated in FIG. 1(b) measure the current I flowing in the equivalent circuit models. These voltage source models $V_0$ and $V_1$ are components that are set for the sake of convenience in LTspice to measure currents in their respective circuits, have their setting voltage V of 0 V, and are used as a substitute for an ammeter. In the present embodiment, of the measured current I, the direct current Idc is a reference current Iref. The voltage source models $V_0$ and $V_1$ constitute current referring elements configured to refer to the current Iref flowing in an inductor being a target for simulation. In the present embodiment, of the current I, only the direct current Idc is referred to. Both of the direct current Idc and the alternating current Iac may also be referred to and may be defined as the reference current Iref.

A control voltage source $B_1$ illustrated in FIG. 1(b) generates difference voltages $\Delta V_{L1}$ and $\Delta V_{R1}$ between voltages $V_{L1}(Idc)$ and $V_{R1}(Idc)$ occurring when the direct current is superimposed and voltages $V_{L1}$ and $V_{R1}$ occurring when no direct current is superimposed on the basis of the change ratios of the circuit constants of the passive circuit elements $L_1$ and $R_1$, that is, characteristic change ratios $k_{L1}(Idc)$ and $k_{R1}(Idc)$ and the voltages $V_{L1}$ and $V_{R1}$ occurring when no direct current is superimposed, as described below. Here, the characteristic change ratios $k_{L1}(Idc)$ and $k_{R1}(Idc)$ are ratios of the circuit constants of the passive circuit elements $L_1$ and $R_1$ when the direct current Idc is superimposed to the circuit constants thereof when the direct current Idc is not superimposed. The voltages $V_{L1}$ and $V_{R1}$ occurring when no direct current is superimposed are voltages occurring in the passive circuit elements $L_1$ and $R_1$ when the direct current Idc is not superimposed. The voltages $V_{L1}(Idc)$ and $V_{R1}(Idc)$ occurring when the direct current is superimposed are voltages occurring in the passive circuit elements $L_1$ and $R_1$ when the direct current Idc is superimposed. The control voltage source $B_1$ is connected in series to the passive circuit elements $L_1$ and $R_1$ whose characteristics are changed by the superimposition of the direct current Idc, as illustrated in the drawing.

The passive circuit elements $L_1$ and $R_1$ in each equivalent circuit model indicate the ones having invariant circuit constants independent of the superimposed direct current Idc. Voltage changes in the passive circuit elements $L_1$ and $R_1$ caused by changes in characteristics are represented by the control voltage source $B_1$. The control voltage source $B_1$ is a component handled as a behavior voltage source model in LTspice, and its value is determined dependently on a current Iref referred to and the voltages $V_{L2}$ and $V_{R1}$ occurring when no direct current is superimposed.

Figure 2:
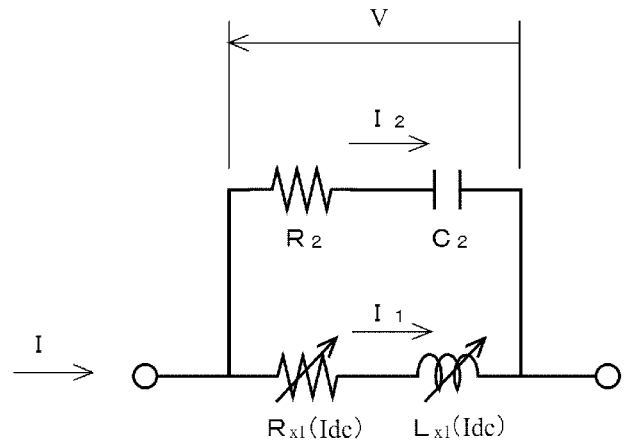
FIG. 2($a$) is a circuit diagram that illustrates an inductor nonlinear equivalent circuit model when the direct current is superimposed using a variable resistive element $R_{X1}(Idc)$ and a variable inductive element $L_{X1}(Idc)$ and FIG. 2($b$) is a circuit diagram that illustrates an inductor nonlinear equivalent circuit model when the direct current is superimposed and that is depicted by transforming the variable resistive element $R_{X1}(Idc)$ and variable inductive element $L_{X1}(Idc)$ into an equivalent model in the first embodiment.
Figure 2:
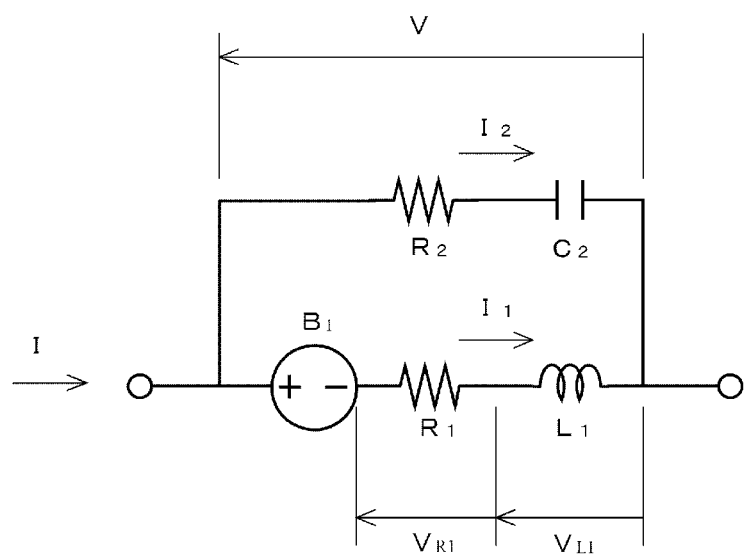

When the circuit constants of the resistive element $R_1$ and the inductive element $L_1$ are changed by the superimposition of the direct current Idc, originally, as illustrated in the circuit diagram of FIG. 2(a), the resistive element $R_1$ is expressed as a variable resistive element $R_{x1}(Idc)$ whose resistance value varies dependently on the value of the superimposed direct current Idc, and the inductive element $L_1$ is expressed as a variable inductive element $L_{x1}(Idc)$ whose reactance varies dependently on the value of the superimposed direct current Idc. Here, the series circuit of the resistive element $R_1$ and inductive element $L_1$ is connected in parallel to the series circuit of a resistive element $R_2$ and capacitive element $C_2$. The resistive element R2 and capacitive element $C_2$ have circuit constants that are not changed by the superimposition of the direct current Idc and that are invariant. Thus the element symbols of the resistive element $R_2$ and capacitive element $C_2$ in the circuit diagrams have no arrows indicating variability, unlike the variable inductive element $L_{x1}(Idc)$ and variable resistive element $R_{x1}(Idc)$.

It is assumed that the current I flows in the input terminal in this circuit, a current $I_1$ flows in the series circuit of the variable resistive element $R_{x1}(Idc)$ and variable inductive element $L_{x1}(Idc)$, and a current $I_2$ flows in the series circuit of the resistive element $R_2$ and capacitive element $C_2$, as illustrated in the drawings. In this case, the current I flowing in the circuit and the voltage V occurring between the input and output terminals of the circuit are expressed by the following expressions (4) and (5), respectively.

$$I = I_1 + I_2 \tag{4}$$

$$V = R_{X1}(Idc) \cdot I_1 + L_{X1}(Idc) \cdot dI_1/dt \tag{5}$$

Figure 3:
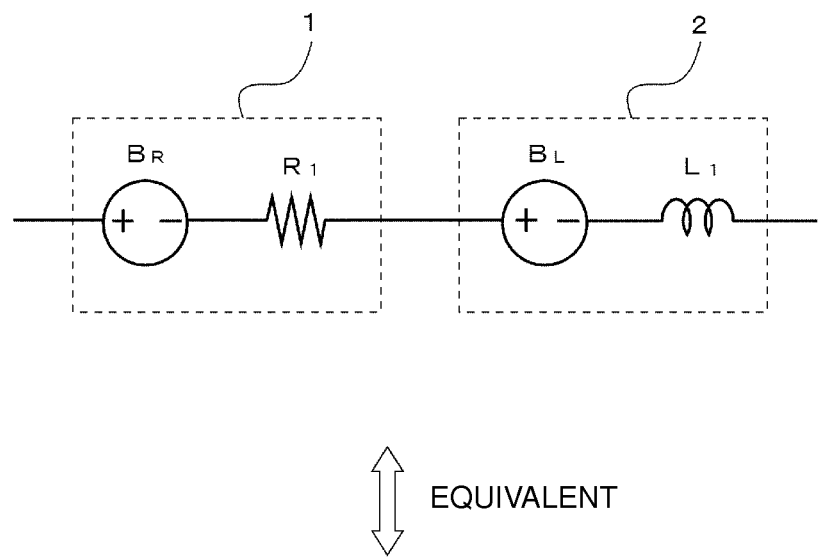
FIG. 3($a$) illustrates a series circuit of a resistive element $R_1$ and an inductor element $L_1$ whose nonlinear characteristics when the direct current is superimposed are represented using a control voltage source $B_R$ and a control voltage source $B_L$ in the first embodiment and FIG. 3($b$) illustrates a series circuit of the resistive element $R_1$ and the inductor element $L_1$ whose nonlinear characteristics when the direct current is superimposed are represented using a single control voltage source $(B_R+B_L)$.
Figure 3:
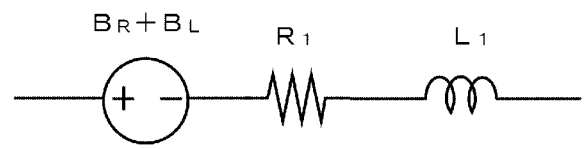

In the present embodiment, the variable resistive element $R_{X1}(Idc)$, whose circuit constant is changed by the superimposition of the direct current Idc, is expressed as a series circuit 1 of the control voltage source $B_R$ handled as a behavior voltage source model in LTspice and the resistive element $R_1$, as illustrated in FIG. 3(a). The variable inductive element $L_{X1}(Idc)$, whose circuit constant is changed by the superimposition of the direct current Idc, is expressed as a series circuit 2 of the control voltage source $B_L$ handled as a behavior voltage source model in LTspice and the inductive element $L_1$, as illustrated in FIG. 3(a). The resistive element $R_1$ and the inductive element $L_1$ are the same as those illustrated in FIG. 1 and indicate the ones having invariable circuit constants independent of the superimposed direct current Idc.

The control voltage source $B_R$ generates a voltage variation in the resistive element $R_1$ caused by the superimposition of the direct current Idc as a difference voltage $\Delta V_{R1}(Idc)$ in accordance with the value of the direct current Idc. The control voltage source $B_L$ generates a voltage variation in the inductive element $L_1$ caused by the superimposition of the direct current Idc as a difference voltage $\Delta V_{L1}(Idc)$ in accordance with the value of the direct current Idc. The control voltage sources $B_R$ and $B_L$, which are connected in series, can be expressed as a single control voltage source $(B_R+B_L)$, as illustrated in FIG. 3(b). The value of the voltage generated by the control voltage source $(B_R+B_L)$ is the sum of the value of the voltage generated by the control voltage source $B_R$ and that by the control voltage source $B_L$.

By transforming the variable resistive element $R_{X1}(Idc)$ and the variable inductive element $L_{X1}(Idc)$ in an equivalent model as described above, the original circuit illustrated in FIG. 2(a) is replaced with the nonlinear equivalent circuit model in the present embodiment illustrated in FIG. 2(b). That is, the series circuit of the variable resistive element $R_{X1}(Idc)$ and the variable inductive element $L_{X1}(Idc)$ illustrated in FIG. 2(a) is replaced with the circuit in which the series circuit of the resistive element $R_1$ and inductive element $L_1$ is connected in series to the control voltage source $B_1$, as illustrated in FIG. 2(b). The control voltage source $B_1$ corresponds to the control voltage source $(B_R+B_L)$ illustrated in FIG. 3(b) and generates a voltage variation in each of the resistive element $R_1$ and inductive element $L_1$ caused by the superimposition of the direct current Idc as a difference voltage $\Delta V_{X1}(Idc)$ in accordance with the value of the superimposed direct current Idc. The voltage $V_{R1}$ occurring when no direct current is superimposed occurs across the resistive element $R_1$, and the voltage $V_{L1}$ occurring when no direct current is superimposed occurs across the inductive element $L_1$.

In this case, the voltage V occurring between the input and output terminals of the nonlinear equivalent circuit model is expressed by the following expression (6).

$$V = R_1 \cdot I_1 + L_1 \cdot dI_1/dt + \Delta V_{X1}(Idc) \tag{6}$$

The difference voltage $\Delta V_{X1}(Idc)$ is the sum of the difference voltage $\Delta V_{R1}(Idc)$, which is the voltage variation in the resistive element $R_1$, and the difference voltage $\Delta V_{L1}(Idc)$, which is the voltage variation in the inductive element $L_1$, and is thus expressed by the following expression (7).

$$\Delta V_{X1}(Idc) = \Delta V_{R1}(Idc) + \Delta V_{L1}(Idc) \tag{7}$$

The difference voltage $\Delta V_{R1}(Idc)$ is the difference between the voltage $V_{R1}(Idc)$ occurring when the direct current is superimposed and the voltage $V_{R1}$ occurring when no direct current is superimposed in the resistive element $R_1$ and is thus expressed by the following expression (8).

$$\Delta V_{R1}(Idc) = V_{R1}(Idc) - V_{R1} \quad (8)$$
$$= (R_{x1}(Idc) - R_1) \cdot I_1$$
$$= (k_{R1}(Idc) - 1) \cdot R_1 \cdot I_1$$
$$= (k_{R1}(Idc) - 1) \cdot V_{R1}$$

Here, the characteristic change ratio $k_{R1}(Idc)$ is the ratio of the circuit constant $R_{x1}(Idc)$ when the direct current Idc is superimposed to the circuit constant $R_1$ when the direct current Idc is not superimposed in the passive circuit element $R_1$ and is expressed by the following expression (9).

$$k_{R1}(Idc) = R_{x1}(Idc)/R_1 \quad (9)$$

The control voltage source $B_1$ generates the difference voltage $\Delta V_{R1}(Idc)$ between the voltage $V_{R1}(Idc)$ occurring when the direct current is superimposed and the voltage $V_{R1}$ occurring when no direct current is superimposed by multiplying the value in which one is subtracted from the characteristic change ratio $k_{R1}(Idc)$ by the voltage $V_{R1}$ occurring when no direct current is superimposed, as indicated by Expression (8), that is, on the basis of the characteristic change ratio $k_{R1}(Idc)$ and the voltage $V_{R1}$ occurring when no direct current is superimposed.

The difference voltage $\Delta V_{L1}(Idc)$ is the difference between the voltage $V_{L1}(Idc)$ occurring when the direct current is superimposed and the voltage $V_{L1}$ occurring when no direct current is superimposed in the inductive element $L_1$ and is thus expressed by the following expression (10).

$$\Delta V_{L1}(Idc) = V_{L1}(Idc) - V_{L1} \quad (10)$$
$$= (L_{x1}(Idc) - L_1) \cdot dI_1/dt$$
$$= (k_{L1}(Idc) - 1) \cdot L_1 \cdot dI_1/dt$$
$$= (k_{L1}(Idc) - 1) \cdot V_{L1}$$

Here, the characteristic change ratio $k_{L1}(Idc)$ is the ratio of the circuit constant $L_{x1}(Idc)$ when the direct current Idc is superimposed to the circuit constant $L_1$ when the direct current Idc is not superimposed in the passive circuit element $L_1$ and is expressed by the following expression (11).

$$k_{L1}(Idc) = L_{x1}(Idc)/L_1 \quad (11)$$

The control voltage source $B_1$ generates the difference voltage $\Delta V_{L1}(Idc)$ between the voltage $V_{L1}(Idc)$ occurring when the direct current is superimposed and the voltage $V_{L1}$ occurring when no direct current is superimposed by multiplying the value in which one is subtracted from the characteristic change ratio $k_{L1}(Idc)$ by the voltage $V_{L1}$ occurring when no direct current is superimposed, as indicated by Expression (10), that is, on the basis of the characteristic change ratio $k_{L1}(Idc)$ and the voltage $V_{L1}$ occurring when no direct current is superimposed.

In the present embodiment, as illustrated in FIGS. 1(a) and 1(b), the voltage source models $V_0$ and $V_1$, which constitute the current referring elements, are disposed on the input terminals in the equivalent circuit models. The control voltage source $B_1$ refers to the current Iref at the input terminal in the equivalent circuit model at the time of generating the difference voltages $\Delta V_{L1}(Idc)$ and $\Delta V_{R1}(Idc)$. The voltage source models $V_0$ and $V_1$ may be disposed on the output terminals in the equivalent circuit models, and the control voltage source $B_1$ may refer to the current Iref at the output terminal in the equivalent circuit model. The control voltage source $B_1$ refers to the voltages $V_{L1}$ and $V_{R1}$ occurring when no direct current is superimposed at both terminals of the passive circuit elements L1 and $R_1$ at the time of generating the difference voltages $\Delta V_{L1}$ and $\Delta V_{R1}$.

The characteristic change ratios $k_{R1}(Idc)$ and $k_{L1}(Idc)$ are calculated by using an approximate function exp(f(x)) in accordance with the reference current Iref (=Idc), which is measured by each of the voltage source models $V_0$ and $V_1$. The approximate function exp(f(x)) is expressed as described below (see FIGS. 15(a), 15(b), 16(a) and 16(b)) using the reference current Iref flowing in the inductor as a variable x on the basis of actually measured values. In the present embodiment, the approximate function exp(f(x)) is given by an even function in the form of a polynomial expression that includes no odd number exponents. The difference voltages $\Delta V_{R1}(Idc)$ and $\Delta V_{L1}(Idc)$ expressed by Expressions (8) and (10) are given in the form of functions of the following expressions (12) and (13) using the approximate function exp(f(x)).

$$\Delta V_{R1}(Idc) = [\exp(f(x)) - 1] \cdot V_{R1} \quad (12)$$

$$\Delta V_{L1}(Idc) = [\exp(f(x)) - 1] \cdot V_{L1} \quad (13)$$

In the inductor simulation method in the present embodiment, first, the inductor equivalent circuit is expressed using the series circuit of the passive circuit elements $L_1$ and $R_1$, and the nonlinear equivalent circuit model illustrated in FIG. 1(b) is established. Then, the characteristic change ratios $k_{L1}(Idc)$ and $k_{R1}(Idc)$ of the passive circuit elements $L_1$ and $R_1$ when the direct current Idc is superimposed are expressed as the approximate function exp(f(x)) using the reference current Iref as a variable x on the basis of actually measured values. Next, the reference current Iref is referred to by the control voltage source $B_1$, which is connected in series to the passive circuit elements $L_1$ and $R_1$, and the characteristic change ratios $k_{L1}(Idc)$ and $k_{R1}(Idc)$ are calculated by using the approximate function exp(f(x)) in accordance with the reference current Iref, which is measured by each of the voltage source models $V_0$ and $V_1$. The voltages $V_{L1}$ and $V_{R1}$ occurring when no direct current is superimposed at both terminals of the passive circuit elements $L_1$ and $R_1$ are referred to by the control voltage source $B_1$. Then, the difference voltage $\Delta V_{L1}(Idc)$ between the voltage $V_{L1}(Idc)$ occurring when the direct current is superimposed and the voltage $V_{L1}$ occurring when no direct current is superimposed and the difference voltage $\Delta V_{R1}(Idc)$ between the voltage $V_{R1}(Idc)$ occurring when the direct current is superimposed and the voltage $V_{R1}$ occurring when no direct current is superimposed are generated by the control voltage source $B_1$ on the basis of the characteristic change ratios $k_{L1}(Idc)$ and $k_{R1}(Idc)$ and the voltages $V_{L1}$ and $V_{R1}$ occurring when no direct current is superimposed, the difference voltages $\Delta V_{L1}(Idc)$ and $\Delta V_{R1}(Idc)$ are superimposed on the voltages $V_{L1}$ and $V_{R1}$ occurring when no direct current is superimposed, and thus the nonlinear characteristics of the inductor when the direct current Idc is superimposed are simulated.

Figure 4:
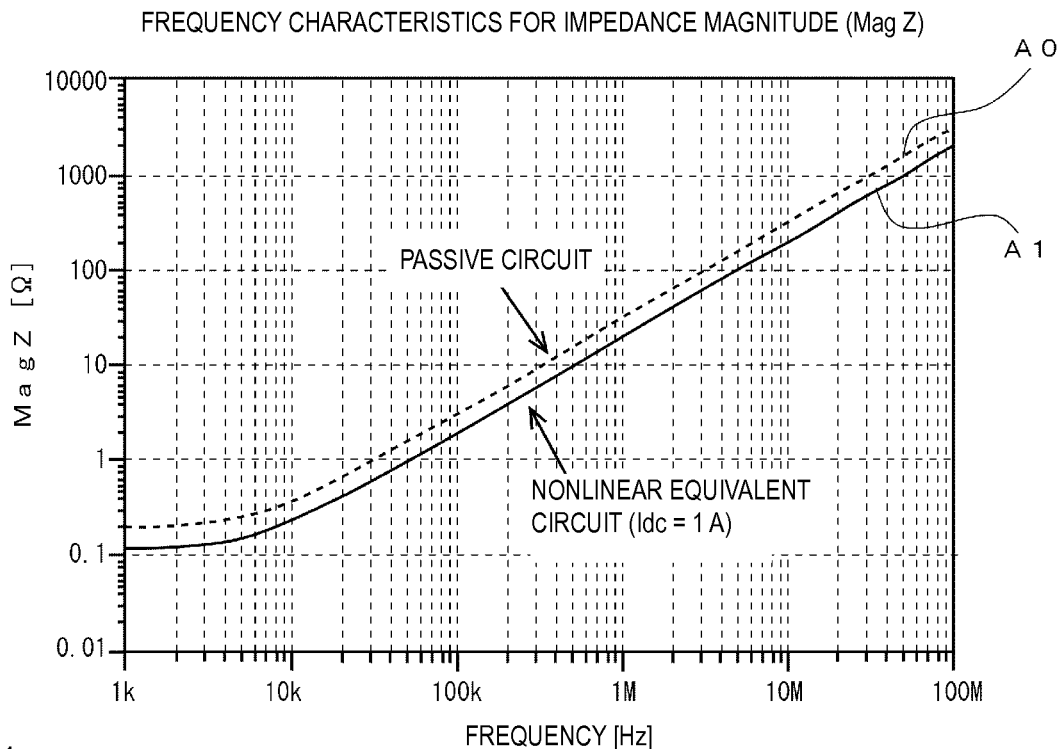
FIG. 4($a$) is a graph that represents frequency characteristics for magnitude MagZ of inductor impedance Z calculated from the nonlinear equivalent circuit model illustrated in FIG. 1($b$) in comparison with characteristics calculated from the passive equivalent circuit model illustrated in FIG. 1($a$) and FIG. 4($b$) is a graph that represents frequency characteristics for inductor equivalent series resistance ESR calculated from the nonlinear equivalent circuit model illustrated in FIG. 1($b$) in comparison with characteristics calculated from the passive equivalent circuit model illustrated in FIG. 1($a$).
Figure 4:
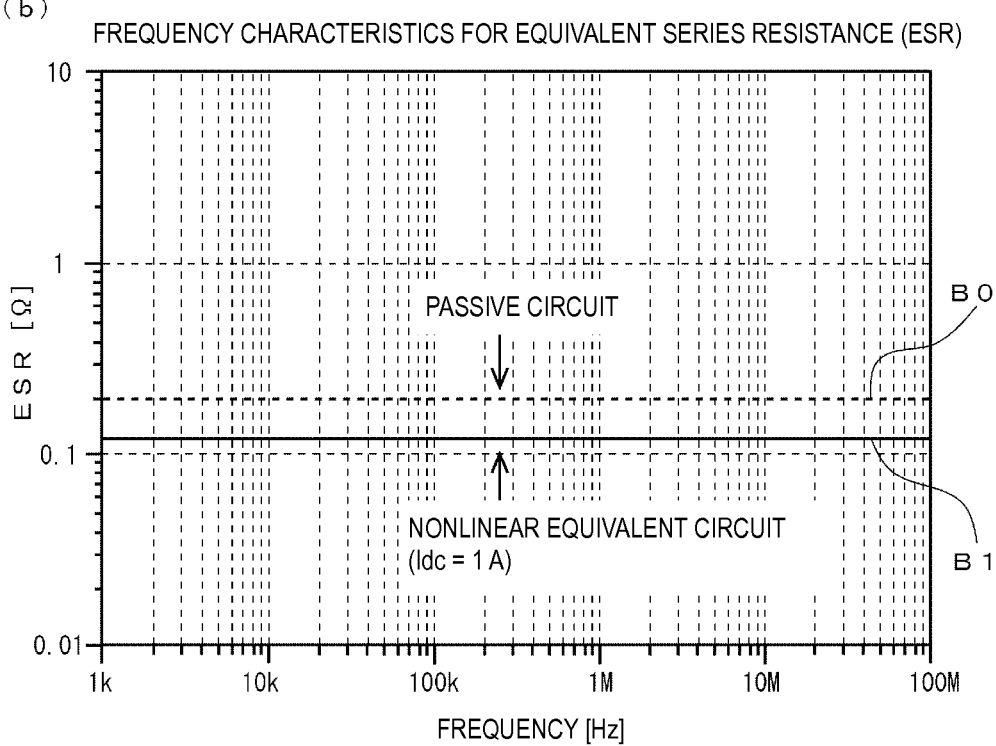

FIG. 4(a) is a graph that represents comparison between frequency characteristics for magnitude MagZ of inductor impedance Z calculated from the nonlinear equivalent circuit model illustrated in FIG. 1(b) obtained by the above-described simulation for the nonlinear characteristics of the inductor and frequency characteristics for the same magnitude MagZ of inductor impedance Z calculated from the passive equivalent circuit model illustrated in FIG. 1(a). In this graph, the horizontal axis indicates the frequency (Hz), and the vertical axis indicates the value (Ω) of magnitude MagZ. Frequency characteristics A1 indicated by the solid line are characteristics when the superimposed direct current Idc is 1 A calculated from the nonlinear equivalent circuit model. Frequency characteristics A0 indicated by the broken line are characteristics when the superimposed direct current Idc is zero calculated from the passive equivalent circuit model.

FIG. 4(b) is a graph that represents comparison between frequency characteristics for equivalent series resistance ESR of the inductor calculated from the nonlinear equivalent circuit model illustrated in FIG. 1(b) obtained by the above-described simulation for the nonlinear characteristics of the inductor and frequency characteristics for the same equivalent series resistance ESR calculated from the passive equivalent circuit model illustrated in FIG. 1(a). In this graph, the horizontal axis indicates the frequency (Hz), and the vertical axis indicates the value (Ω) of the equivalent series resistance ESR. Frequency characteristics B1 indicated by the solid line are characteristics when the superimposed direct current Idc is 1 (A) calculated from the nonlinear equivalent circuit model. Frequency characteristics B0 indicated by the broken line are characteristics when the superimposed direct current Idc is zero calculated from the passive equivalent circuit model.

As illustrated in the graph of FIG. 4(a), because of the superimposition of the direct current Idc, the value of Magz in the frequency characteristics A1 for the impedance magnitude MagZ is smaller than that in the frequency characteristics A0 when no direct current is superimposed, and the impedance is changed by the superimposition of the direct current Idc. In a low-frequency range, they approach the characteristics for the equivalent series resistance ESR illustrated in FIG. 4(b). Similarly, as illustrated in the graph of FIG. 4(b), because of the superimposition of the direct current Idc, the value of ESR in the frequency characteristics B1 for the equivalent series resistance ESR is also smaller than that in the frequency characteristics B0 when no direct current is superimposed, and the equivalent series resistance ESR is changed by the superimposition of the direct current Idc. The value of the equivalent series resistance ESR in each of both the frequency characteristics B1 and B0 is a fixed value independent of the frequency.

In the inductor simulation method and inductor nonlinear equivalent circuit model in the first embodiment, as described above, the characteristic change ratios $k_{L1}$(Idc) and $k_{R1}$(Idc) of the passive circuit elements $L_1$ and $R_1$ when the direct current Idc is superimposed are expressed by the approximate function $\exp(f(x))$ using the reference current Iref flowing in the inductor as the variable x on the basis of actually measured values. Accordingly, the characteristic change ratios $k_{L1}$(Idc) and $k_{R1}$(Idc) expressed by Expressions (9) and (11) are calculated by using the approximate function $\exp(f(x))$ in accordance with the referred current Iref. The voltages $V_{L1}$(Idc) and $V_{R1}$(Idc) occurring when the direct current is superimposed can be obtained by superimposing the difference voltages $\Delta V_{L1}$(Idc) and $\Delta V_{R1}$(Idc) expressed by Expressions (8) and (10) on the voltages $V_{L1}$ and $V_{R1}$ occurring when no direct current is superimposed. Consequently, the difference voltages $\Delta V_{L1}$(Idc) and $\Delta V_{R1}$(Idc) are generated by the control voltage source $B_1$ on the basis of the characteristic change ratios $k_{L1}$(Idc) and $k_{R1}$(Idc) and the voltages $V_{L1}$ and $V_{R1}$ occurring when no direct current is superimposed, the passive circuit elements $L_1$ and $R_1$ are connected in series to the control voltage source $B_1$, and the difference voltages $\Delta V_{L1}$(Idc) and $\Delta V_{R1}$(Idc) are superimposed on the voltages $V_{L1}$ and $V_{R1}$ occurring when no direct current is superimposed, thereby enabling simulation of the voltages $V_{L1}$(Idc) and $V_{R1}$(Idc) occurring when the direct current is superimposed in the passive circuit elements $L_1$ and $R_1$.

That is, the characteristic change ratios $k_{L1}$(Idc) and $k_{R1}$(Idc) in the passive circuit elements $L_1$ and $R_1$ are calculated by using the approximate function $\exp(f(x))$ by referring to the current Iref flowing in the inductor, and the difference voltages $\Delta V_{L1}$(Idc) and $\Delta V_{R1}$(Idc) expressed by Expressions (8) and (10) are generated by the control voltage source $B_1$ on the basis of the characteristic change ratios $k_{L1}$(Idc) and $k_{R1}$(Idc) and the voltages $V_{L1}$ and $V_{R1}$ occurring when no direct current is superimposed, thereby enabling simulation capable of performing dynamic tracking for any superimposed direct current Idc. As a result, an inductor simulation method and inductor nonlinear equivalent circuit model enabling precise dynamic simulation of nonlinearity of the inductor when the direct current is superimposed can be easily provided using a simple configuration. The inductor nonlinear equivalent circuit model is obtainable by simply superimposing the difference voltages $\Delta V_{L1}$(Idc) and $\Delta V_{R1}$(Idc) on the voltages $V_{L1}$ and $V_{R1}$ occurring when no direct current is superimposed by the control voltage source $B_1$ with reference to the voltages $V_{L1}$ and $V_{R1}$ occurring when no direct current is superimposed, as described above. Thus, conversely, by removing the control voltage source $B_1$ from the nonlinear equivalent circuit model illustrated in FIG. 1(b), the inductor equivalent circuit model illustrated in FIG. 1(a) corresponding to the voltages $V_{L1}$ and $V_{R1}$ occurring when no direct current is superimposed, that is, in the case where the direct current Idc is not superimposed can be obtained easily.

With the inductor simulation method and inductor nonlinear equivalent circuit model in the first embodiment, when the value of the reference current Iref is zero (x=0), the value of the approximate function $\exp(f(x))$, which is an exponential function, is one, the value of the coefficient $(\exp(f(x))-1)$ in Expressions (12) and (13), which is multiplied to the voltages $V_{L1}$ and $V_{R1}$ occurring when no direct current is superimposed, is zero, and the value of each of the difference voltages $\Delta V_{L1}$(Idc) and $\Delta V_{R1}$(Idc) is also zero. When the value of the reference current Iref is not zero, the value of the approximate function $\exp(f(x))$ is larger than one, and the value of the coefficient $(\exp(f(x))-1)$, which is multiplied to the voltage $V_0$ occurring when no direct current is superimposed, is larger than zero. Thus, the difference voltages $\Delta V_{L1}$(Idc) and $\Delta V_{R1}$(Idc) are calculated in accordance with the reference current Iref on all occasions, the characteristics of the inductor are simulated, and the results are utilized for understanding the quality of the inductor.

With the inductor simulation method and inductor nonlinear equivalent circuit model in the first embodiment, the approximate function $\exp(f(x))$ is represented as an even function in the form of a polynomial expression that includes no odd number exponents. Thus, unlike known inductor simulations, even if the sign of the direct-current bias is inversed or the value of the direct-current bias changes suddenly, the characteristic change ratios $k_{L1}$(Idc) and $k_{R1}$(Idc) can be appropriately approximated by the approximate function $\exp(f(x))$.

With the inductor simulation method and inductor nonlinear equivalent circuit model in the first embodiment, unlike a method of performing calculation by setting the reference current Iref or the voltages $V_{L1}$ and $V_{R1}$ occurring when no direct current is superimposed separately from the equivalent circuit model, an instantaneous current occurring at the input terminal or output terminal in the equivalent circuit model or an instantaneous voltage occurring across each of the passive circuit elements $L_1$ and $R_1$ in the equivalent circuit model is referred to, and the difference voltages $\Delta V_{L1}(Idc)$ and $\Delta V_{R1}(Idc)$ are calculated. Thus, the reference current Iref and the voltages $V_{L1}$ and $V_{R1}$ occurring when no direct current is superimposed for use in calculation of the difference voltages $\Delta V_{L1}(Idc)$ and $\Delta V_{R1}(Idc)$ can be referred to without time lags, and transient response analysis for nonlinearity of the inductor can be made at high speed and with high precision.

Figure 5A:
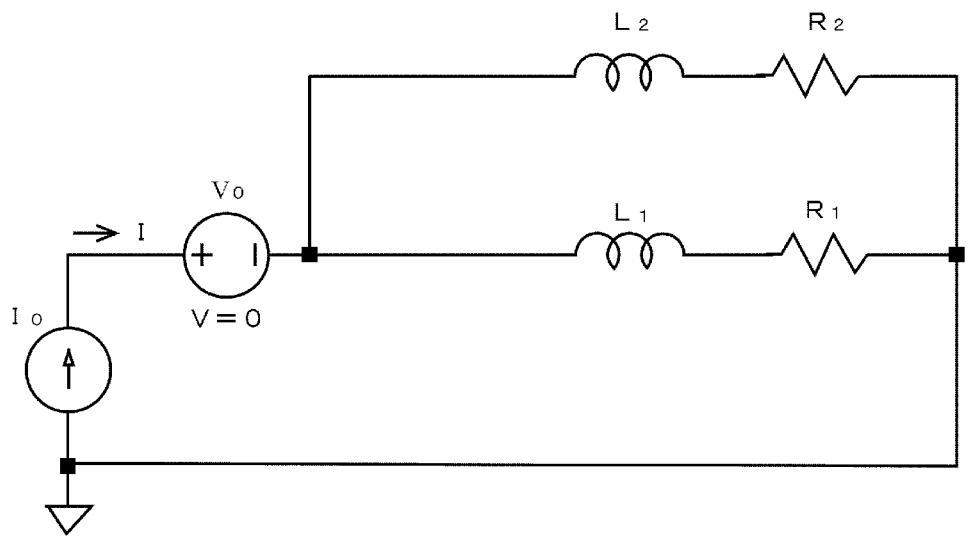
FIG. 5($a$) is a circuit diagram that illustrates an inductor passive equivalent circuit model when no direct current is superimposed in a second embodiment of the present disclosure and FIG. 5($b$) is a circuit diagram that illustrates an inductor nonlinear equivalent circuit model when the direct current is superimposed in the second embodiment.
Figure 5B:
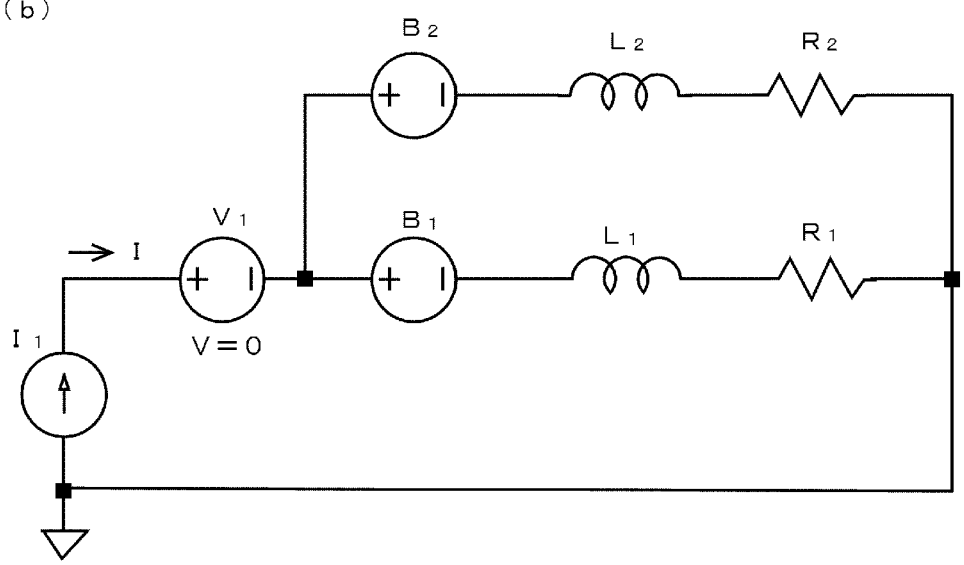

FIG. 5(a) is a circuit diagram that illustrates an inductor passive equivalent circuit model when no direct current is superimposed in a second embodiment of the present disclosure. FIG. 5(b) is a circuit diagram that illustrates an inductor nonlinear equivalent circuit model when the direct current is superimposed in the second embodiment. In FIGS. 5(a) and 5(b), the portions identical with or corresponding to those in FIGS. 1(a) and 1(b) have the same reference numerals, and the description thereof is omitted.

In the passive equivalent circuit model and nonlinear equivalent circuit model in the second embodiment, the series circuit of the inductive element $L_1$ and the resistive element $R_1$ is connected in parallel to the series circuit of the inductive element $L_2$ and the resistive element $R_2$, and they constitute a passive circuit element that represents an equivalent circuit of an inductor being a target for simulation. In the nonlinear equivalent circuit model illustrated in FIG. 5(b), the series circuit of the inductive element $L_1$ and the resistive element $R_1$ is connected in series to the control voltage source $B_1$, and the series circuit of the inductive element $L_2$ and the resistive element $R_2$ is connected in series to a control voltage source $B_2$, which is similar to the control voltage source $B_1$. That is, in the equivalent circuit models in the second embodiment, the series circuit of the control voltage source $B_1$ and the passive circuit elements $L_1$ and $R_1$ and the series circuit of the control voltage source $B_2$ and the passive circuit elements $L_2$ and $R_2$ are connected in parallel.

In the second embodiment, in the passive equivalent circuit model illustrated in FIG. 5(a), the alternating current Iac on which the direct current Idc is not superimposed is flowed to the parallel circuit of the passive circuit elements $L_1$ and $R_1$ and the passive circuit elements $L_2$ and $R_2$ by the current source model $I_0$ as the current I. In the nonlinear equivalent circuit model illustrated in FIG. 5(b), the alternating current Iac on which the direct current Idc is superimposed is flowed to the parallel circuit of the passive circuit elements $L_1$ and $R_1$ and the passive circuit elements $L_2$ and $R_2$ by the current source model $I_1$ as the current I. Here, in each equivalent circuit, the circuit constant of the inductive element $L_1$ is set to 4 µH, the circuit constant of the resistive element $R_1$ is set to 0.2Ω, the circuit constant of the inductive element $L_2$ is set to 100 µH, the circuit constant of the resistive element $R_2$ is set to 1000Ω, and the superimposed direct current Idc is set to 1 A.

The control voltage source $B_1$ illustrated in FIG. 5(b) generates the difference voltages $\Delta V_{L1}(Idc)$ and $\Delta V_{R1}(Idc)$ between the voltages $V_{L1}(Idc)$ and $V_{R1}(Idc)$ occurring when the direct current is superimposed and the voltages $V_{L1}$ and $V_{R1}$ occurring when no direct current is superimposed on the basis of the characteristic change ratios $k_{L1}(Idc)$ and $k_{R1}(Idc)$ for the passive circuit elements $L_1$ and $R_1$ and the voltages $V_{L1}$ and $V_{R1}$ occurring when no direct current is superimposed, as in the simulation method in the first embodiment. The control voltage source $B_2$ generates the difference voltages $\Delta V_{L2}(Idc)$ and $\Delta V_{R2}(Idc)$ between the voltages $V_{L2}(Idc)$ and $V_{R2}(Idc)$ occurring when the direct current is superimposed and the voltages $V_{L2}$ and $V_{R2}$ occurring when no direct current is superimposed on the basis of the characteristic change ratios $k_{L2}(Idc)$ and $k_{R2}(Idc)$ for the passive circuit elements $L_2$ and $R_2$ and the voltages $V_{L2}$ and $V_{R2}$ occurring when no direct current is superimposed, as in the control voltage source $B_1$.

Figure 6:
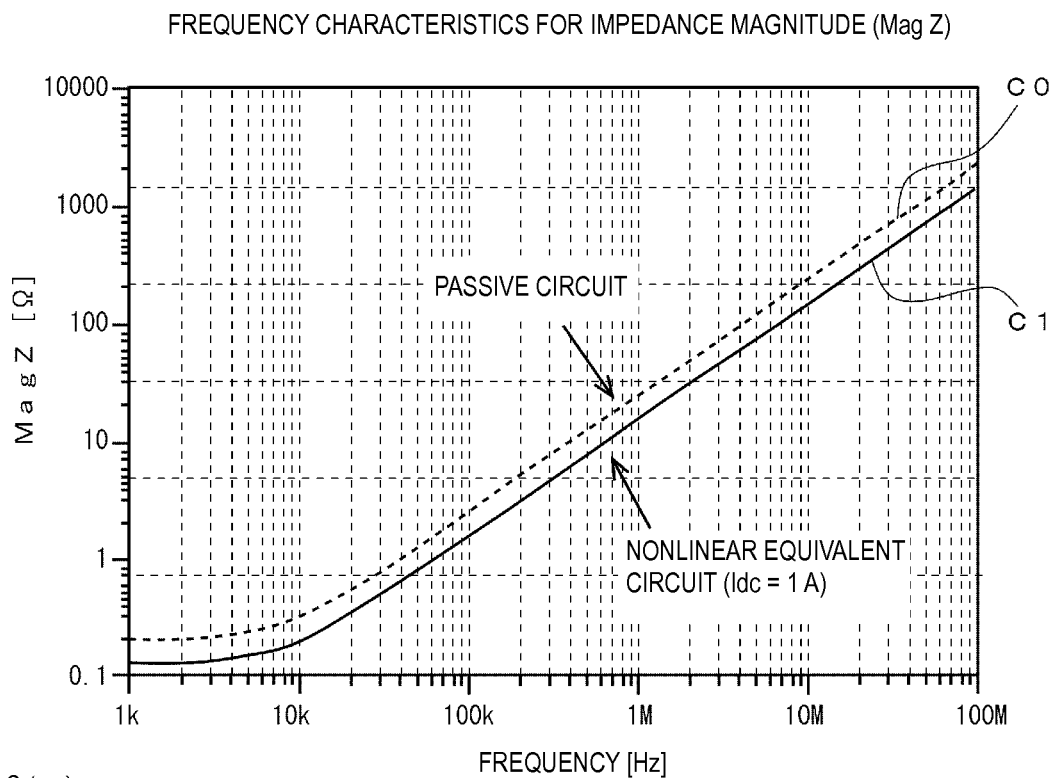
FIG. 6($a$) is a graph that represents frequency characteristics for magnitude MagZ of inductor impedance Z calculated from the nonlinear equivalent circuit model illustrated in FIG. 5($b$) in comparison with characteristics calculated from the passive equivalent circuit model illustrated in FIG. 5($a$) and FIG. 6($b$) is a graph that represents frequency characteristics for inductor equivalent series resistance ESR calculated from the nonlinear equivalent circuit model illustrated in FIG. 5($b$) in comparison with characteristics calculated from the passive equivalent circuit model illustrated in FIG. 5($a$).
Figure 6:
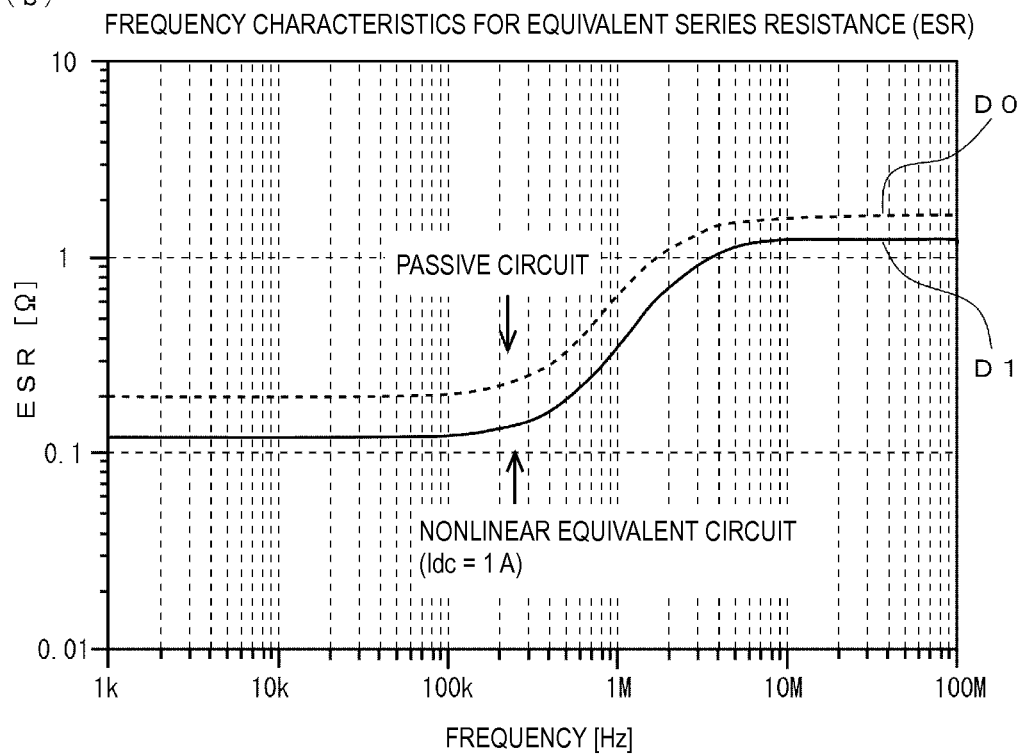

FIG. 6(a) is a graph that represents comparison between frequency characteristics for magnitude MagZ of inductor impedance Z calculated from the nonlinear equivalent circuit model illustrated in FIG. 5(b) and frequency characteristics for the same magnitude MagZ calculated from the passive equivalent circuit model illustrated in FIG. 5(a). In this graph, the horizontal axis indicates the frequency (Hz), and the vertical axis indicates the value (Ω) of magnitude MagZ. Frequency characteristics C1 indicated by the solid line are characteristics when the superimposed direct current Idc is 1 A calculated from the nonlinear equivalent circuit model. Frequency characteristics C0 indicated by the broken line are characteristics when the superimposed direct current Idc is zero calculated from the passive equivalent circuit model.

FIG. 6(b) is a graph that represents comparison between frequency characteristics for equivalent series resistance ESR of the inductor calculated from the nonlinear equivalent circuit model illustrated in FIG. 5(b) and frequency characteristics for the same equivalent series resistance ESR calculated from the passive equivalent circuit model illustrated in FIG. 5(a). In this graph, the horizontal axis indicates the frequency (Hz), and the vertical axis indicates the value (ω) of the equivalent series resistance ESR. Frequency characteristics D1 indicated by the solid line are characteristics when the superimposed direct current Idc is 1 A calculated from the nonlinear equivalent circuit model. Frequency characteristics D0 indicated by the broken line are characteristics when the superimposed direct current Idc is zero calculated from the passive equivalent circuit model.

As illustrated in the graph of FIG. 6(a), because of the superimposition of the direct current Idc, the value of Magz in the frequency characteristics C1 for the impedance magnitude MagZ is also smaller than that in the frequency characteristics C0 when no direct current is superimposed, and the impedance is changed by the superimposition of the direct current Idc, as in the frequency characteristics A1 illustrated in the graph of FIG. 4(a). In a low-frequency range, they approach the characteristics for the equivalent series resistance ESR illustrated in FIG. 6(b). Similarly, as illustrated in the graph of FIG. 6(b), because of the superimposition of the direct current Idc, the value of ESR in the frequency characteristics D1 for the equivalent series resistance ESR is also smaller than that in the frequency characteristics D0 when no direct current is superimposed, and the equivalent series resistance ESR is changed by the superimposition of the direct current Idc, as in the frequency characteristics B1 illustrated in the graph of FIG. 4(b). However, unlike the frequency characteristics B1 and B0 illustrated in the graph of FIG. 4(b), the values of the equivalent series resistance ESR in both the frequency characteristics D1 and D0 vary in accordance with the frequency and has frequency characteristics.

With the inductor simulation method and inductor nonlinear equivalent circuit model in the second embodiment, the simple series circuit of the control voltage source $B_1$ and the passive circuit elements $L_1$ and $R_1$ and the simple series circuit of the control voltage source $B_2$ and the passive circuit elements $L_2$ and $R_2$ are simply connected in parallel. An increased number of parallel connections can enhance the accuracy of simulation of the equivalent circuit model.

Thus, the equivalent circuit model with high accuracy of simulation can be configured in a regular and transparent manner. Because the plurality of series circuits of the control voltage sources $B_1$ and $B_2$ and the passive circuit elements $L_1$, $R_1$, $L_2$, and $R_2$ are simply connected in parallel, the characteristics of the passive circuit elements $L_1$, $R_1$, $L_2$, and $R_2$ when the direct current is superimposed can be simulated by a systematic calculation procedure.

In the above-described passive equivalent circuit models in the above-described first embodiment and the second embodiment, as illustrated in FIG. 7(b), the characteristics of the passive circuit element when the direct current Idc is not superimposed are represented by the configuration in which the series circuit of the inductive element L and resistive element R constitutes the passive circuit element. In the nonlinear equivalent circuit model, as illustrated in FIG. 7(e), the characteristics of the passive circuit element when the direct current Idc is superimposed are simulated by using the configuration in which that series circuit is connected in series to the control voltage source B.

As in the passive equivalent circuit model illustrated in FIG. 7(a), the single inductive element L may constitute the passive circuit element. In this case, the nonlinear equivalent circuit model is the configuration in which the single inductive element L is connected in series to the control voltage source B, as illustrated in FIG. 7(d). As in the passive equivalent circuit model illustrated in FIG. 7(c), the series circuit of the inductive element L, the resistive element R, and the capacitive element C may constitute the passive circuit element. In this case, the nonlinear equivalent circuit model is the configuration in which that series circuit is connected in series to the control voltage source B, as illustrated in FIG. 7(f). Even in the passive circuit element configured in such a manner, the characteristics of the passive circuit element when the direct current Idc is not superimposed are represented by the single inductive element L or the series circuit of the inductive element L, the resistive element R, and the capacitive element C. The characteristics of the passive circuit element when the direct current Idc is superimposed are simulated by using the configuration in which that circuit is connected in series to the control voltage source B.

In the above-described first embodiment and the second embodiment, the cases where the characteristics of all of the passive circuit elements $L_1$, $R_1$, $L_2$, and $R_2$ are changed by the superimposition of the direct current Idc are described. However, as in the admittance-developed passive equivalent circuit model illustrated in FIG. 8(a), the equivalent circuit may include passive circuit elements r and c whose characteristics are not changed by the superimposition of the direct current Idc to the inductor. In this case, in the admittance-developed nonlinear equivalent circuit model illustrated in FIG. 8(b), the passive circuit elements Rx, Lx, and Cx (x=1, 2, 3, . . . ), whose characteristics are changed by the superimposition of the direct current Idc, are connected in series to the control voltage sources Bx (x=1, 2, 3, . . . ), the passive circuit elements r and c are not connected to the control voltage sources Bx, and thus the characteristics when the direct current Idc is superimposed are simulated. In FIGS. 8(a) and 8(b), the portions identical with or corresponding to those in FIGS. 7(a) through 7(f) have the same reference numerals, and the description thereof is omitted. Here, the cases where the equivalent circuit model is configured in an admittance-developed manner are described. Each equivalent circuit model may also be configured in an impedance-developed manner such that passive circuit elements are connected in series.

Figure 9:
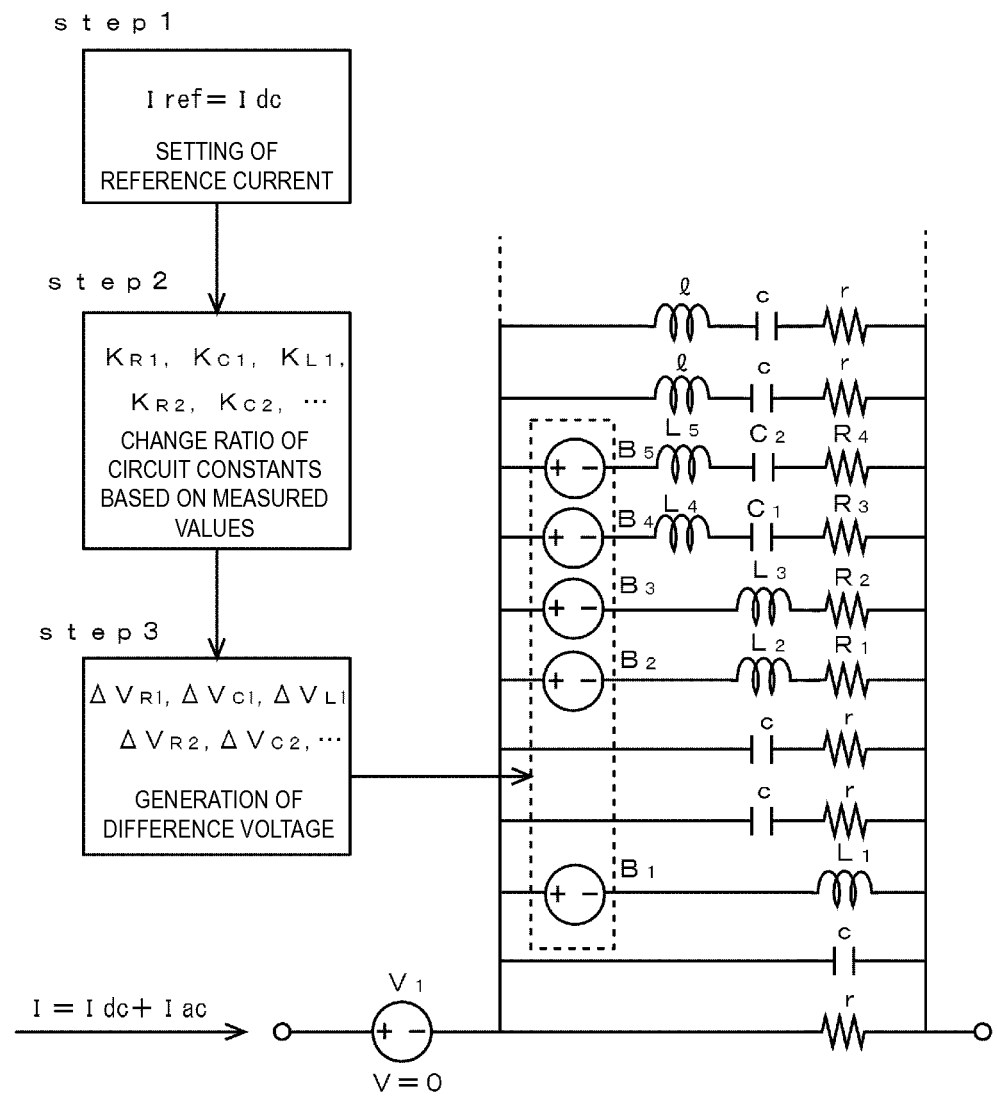
FIG. 9 is a circuit diagram that illustrates a nonlinear equivalent circuit model in a third embodiment of the present disclosure by representing the nonlinear equivalent circuit model illustrated in FIG. 8(b) as a generalized format.

FIG. 9 is a circuit diagram that illustrates a nonlinear equivalent circuit model in a third embodiment of the present disclosure by representing the nonlinear equivalent circuit model illustrated in FIG. 8(b) as a generalized format. In FIG. 9, the portions identical with or corresponding to those in FIG. 8(b) have the same reference numerals, and the description thereof is omitted.

In the inductor simulation method using the general-format nonlinear equivalent circuit model illustrated in FIG. 9, first, the inductor equivalent circuit is represented using passive circuit elements R, L, C, r, l, and c, and the nonlinear equivalent circuit model illustrated in FIG. 9 is established. The inductive element l is a passive circuit element whose characteristics are not changed by the superimposition of the direct current Idc to the inductor, as in the case of the resistive element r and capacitive element c. Then, the current I (=Idc+Iac) in which the direct current Idc is superimposed on the alternating current Iac is flowed to the nonlinear equivalent circuit model by the current source model $I_1$, which is substantially the same as that illustrated in FIGS. 1(a) and 1(b).

In step 1, of the current I, the direct current Idc is referred to as the reference current Iref (Iref=Idc) by the voltage source model $V_1$, which is substantially the same as that in FIGS. 1(a) and 1(b) and used as a substitute for an ammeter. Here, only the direct current Idc of the current I is referred to. Both the direct current Idc and the alternating current Iac may be referred to. Next, in step 2, the characteristic change ratios $k_{RX}$(Iref), $k_{CX}$(Iref), and $k_{LX}$(Iref) for the passive circuit elements Rx, Cx, and Lx (x=1, 2, 3, . . . ) when the direct current Idc is superimposed are represented as the approximate function exp(f(x)) using the reference current Iref as the variable x on the basis of measured values. Then, the reference current Iref measured by the voltage source model $V_1$ is referred to by the control voltage sources Bx (x=1, 2, 3, . . . ), which are connected in series to the passive circuit elements Rx, Cx, and Lx, and the characteristic change ratios $k_{RX}$(Iref), $k_{CX}$(Iref), and $k_{LX}$(Iref) are calculated by using the approximate function exp(f(x)) in accordance with the reference current Iref.

Next, in step 3, the voltages $V_{RX}$, $V_{CX}$, $V_{LX}$ occurring when no direct current is superimposed (x=1, 2, 3, . . . ) across the passive circuit elements Rx, Cx, and Lx are referred to by the control voltage sources $B_X$. Then, the difference voltages $\Delta V_{RX}$(Iref), $\Delta V_{CX}$(Iref), and $\Delta V_{LX}$(Iref) (x=1, 2, 3, . . . ) between voltages $V_{RX}$(Iref), $V_{CX}$(Iref), and $V_{LX}$(Iref) occurring when the direct current is superimposed and the voltages $V_{RX}$, $V_{CX}$, and $V_{LX}$ occurring when no direct current is superimposed are generated as correction voltages by the control voltage sources $B_X$ on the basis of the characteristic change ratios $k_{RX}$(Iref), $k_{CX}$(Iref), and $k_{LX}$(Iref) and the voltages $V_{RX}$, $V_{CX}$, and $V_{LX}$ occurring when no direct current is superimposed. The difference voltages $\Delta V_{RX}$(Iref), $\Delta V_{CX}$(Iref), and $\Delta V_{LX}$(Iref) are superimposed on the voltages $V_{RX}$, $V_{CX}$, and $V_{LX}$ occurring when no direct current is superimposed, and thus the nonlinear characteristics of the inductor when the direct current Idc is superimposed are simulated.

With such inductor simulation in the third embodiment, because the equivalent circuit model includes a combination of the passive circuit elements Rx, Cx, and Lx, whose characteristics are changed by the superimposition of the direct current Idc, and the passive circuit elements r, c, and l, whose characteristics are not changed by the superimposition of the direct current Idc, the precision of the simulation of the nonlinear characteristics of the inductor can be further enhanced, and the frequency band of the simulation can be widened.

Figure 10:
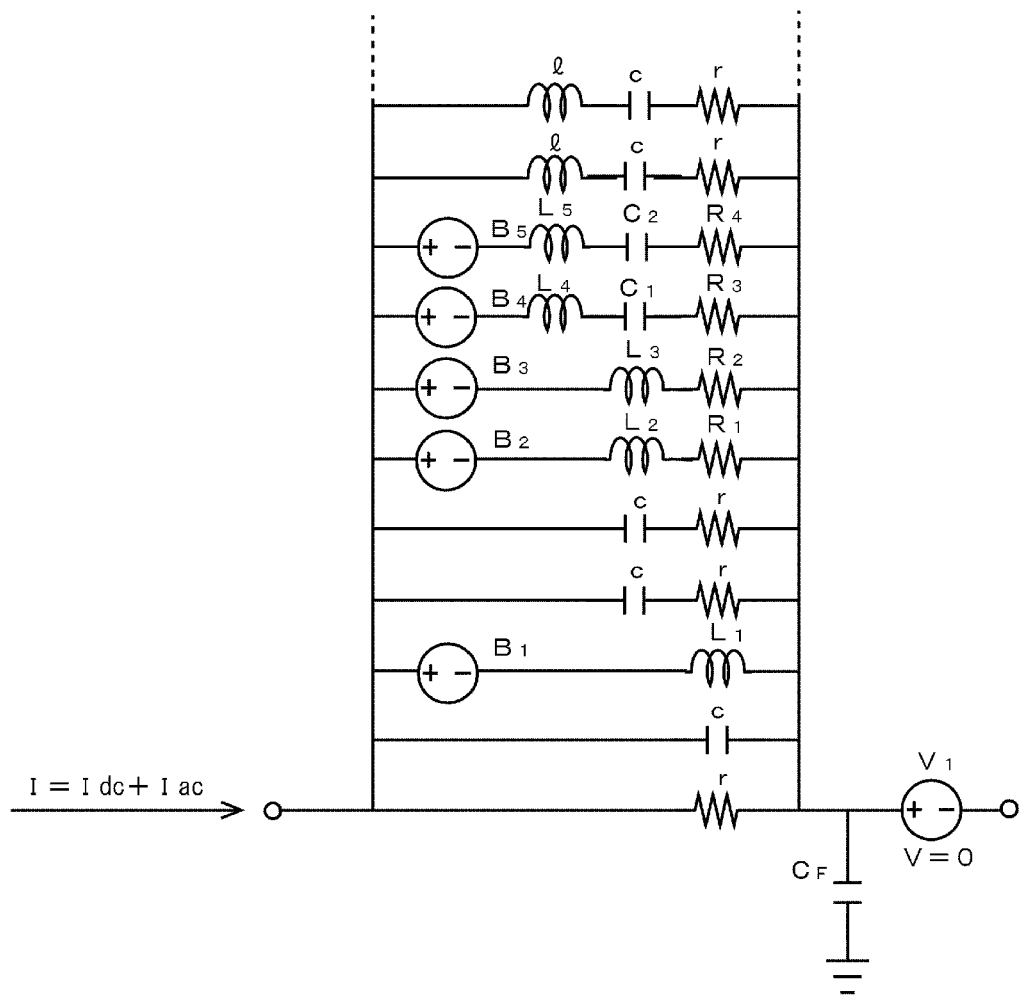
FIG. 10 is a circuit diagram that illustrates a first variation of the nonlinear equivalent circuit model illustrated in FIG. 9.

In the general-format nonlinear equivalent circuit model illustrated in FIG. 9, the cases where the voltage source model $V_1$ used as a substitute for an ammeter is disposed on the input terminal of the equivalent circuit and the reference current Iref is measured on the input terminal side of the equivalent circuit are described. The voltage source model $V_1$ may be disposed on the output terminal of the equivalent circuit such that a smoothing capacitor $C_F$ is disposed before it, as illustrated in FIG. 10, allowing the voltage source model $V_1$ to measure the reference current Iref smoothed by the smoothing capacitor $C_F$ on the output terminal side of the equivalent circuit. In FIG. 10, the portions identical with or corresponding to those in FIG. 9 have the same reference numerals, and the description thereof is omitted.

Figure 11:
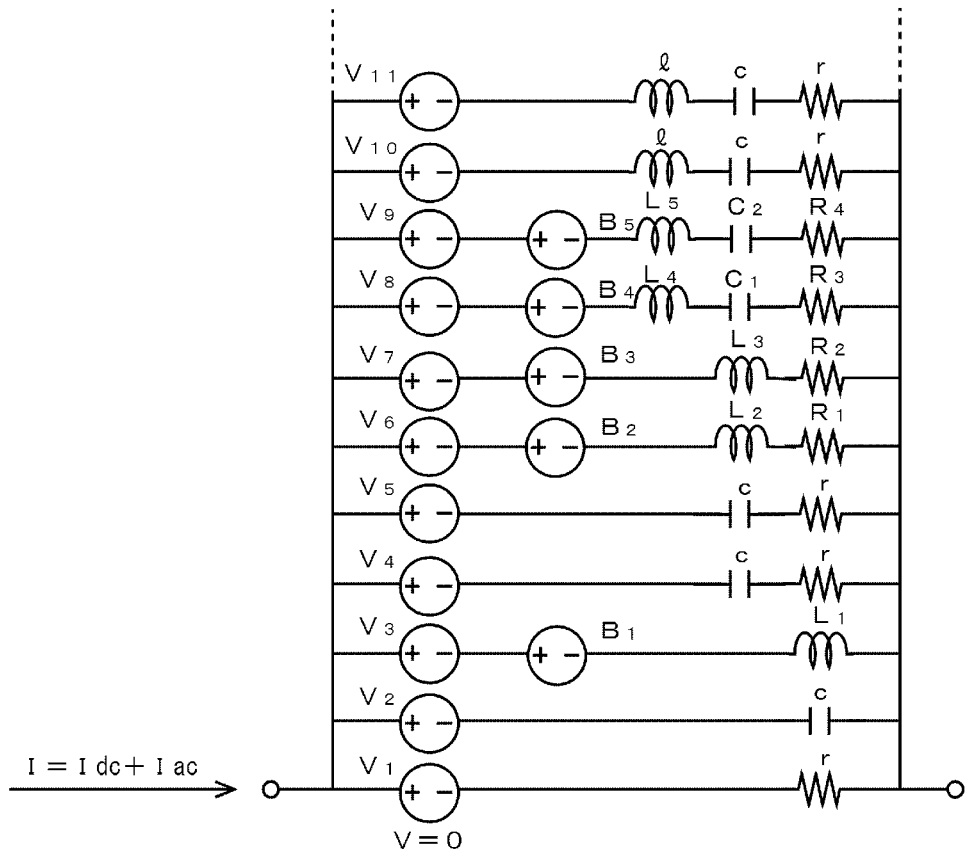
FIG. 11 is a circuit diagram that illustrates a second variation of the nonlinear equivalent circuit model illustrated in FIG. 9.

As illustrated in FIG. 11, voltage source models $V_x$ (x=1, 2, 3, ...) serving as ammeters may be disposed on the input terminals of the circuits each having the single passive circuit element and the series circuits of the passive circuit elements, allowing the reference current Iref to be measured on the input terminal side of the equivalent circuit. In FIG. 11, the portions identical with or corresponding to those in FIG. 9 have the same reference numerals, and the description thereof is omitted.

Figure 12:
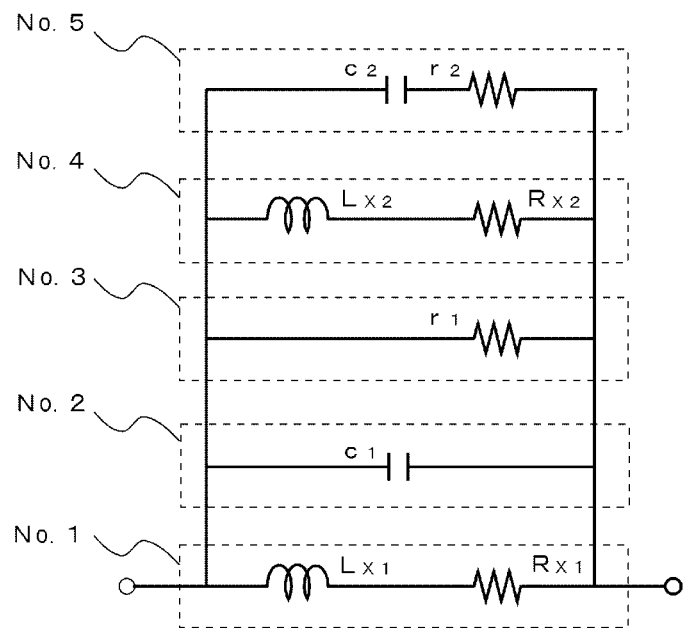
FIG. 12 is a circuit diagram that illustrates one specific example of an inductor admittance-developed equivalent circuit model in a fourth embodiment of the present disclosure, the equivalent circuit model including a combination of passive circuit elements whose characteristics are not changed by superimposition of the direct current Idc.

FIG. 12 is a circuit diagram that illustrates one specific example of an inductor admittance-developed equivalent circuit model in which passive circuit elements $r_1$, $c_1$, $r_2$, and $c_2$ whose characteristics are not changed by the superimposition of the direct current Idc are combined in a fourth embodiment of the present disclosure. The inductor having characteristics to be simulated is a power inductor product with an inductance of 4.7 µH and a rated current of 1100 mA. This power inductor product is hereinafter referred to as sample inductor. In the illustrated equivalent circuit model, the passive circuit elements whose characteristics are changed by the superimposition of the direct current Idc are indicated as $R_{X1}$, $R_{X2}$, $L_{X1}$, and $L_{X2}$. Whether the characteristics are changed or not changed by the superimposition of the direct current Idc is determined by analysis of actually measured values.

This admittance-developed equivalent circuit model has the configuration in which the series circuit No. 1 of the inductive element $L_{X1}$ and the resistive element $R_{X1}$, the circuit No. 2 of the single capacitive element c1, the circuit No. 3 of the single resistive element r1, the series circuit No. 4 of the inductive element $L_{X2}$ and the resistive element $R_{X2}$, and the series circuit No. 5 of the capacitive element c2 and the resistive element r2 are connected in parallel. The parallel circuit of the series circuit No. 1, the circuit No. 2, and the circuit No. 3 fits the frequency characteristics near the main resonant frequency of the sample inductor to be simulated to actual characteristics. The series circuit No. 4 fits the frequency characteristics in the inductive band of the sample inductor to be simulated to actual characteristics. The series circuit No. 5 fits the frequency characteristics in the capacitive band of the sample inductor to be simulated to actual characteristics.

The circuit constants of the circuit elements derived from the above-described fittings are described below. The circuit constants of the inductive element $L_{X1}$ and the resistive element $R_{X1}$ included in the series circuit No. 1 are $3.68 \times 10^{-6}$ H and $1.93 \times 10^{-1}$ Ω, respectively. The circuit constant of the capacitive element c1 in the circuit No. 2 is $3.65 \times 10^{-12}$ F. The circuit constant of the resistive element r1 in the circuit No. 3 is $3.89 \times 10^4$ Ω. The circuit constants of the inductive element $L_{X2}$ and the resistive element $R_{X2}$ in the series circuit No. 4 are $1.31 \times 10^{-4}$ H and $1.37 \times 10^3$ Ω, respectively. The circuit constants of the capacitive element c2 and the resistive element r2 in the series circuit No. 5 are $2.66 \times 10^{-12}$ F and $1.75 \times 10^3$ Ω, respectively.

Figure 13A:
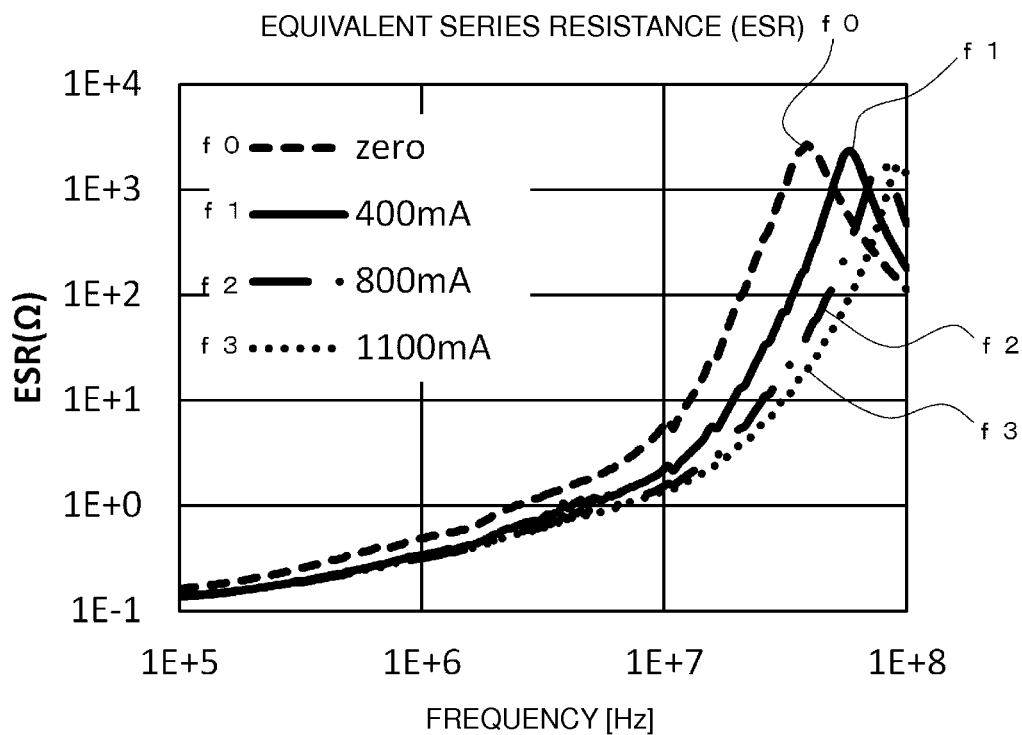
FIG. 13(a) is a graph that represents results of measurement of frequency characteristics for equivalent series resistance ESR of the inductor whose equivalent circuit model is illustrated in FIG. 12 with respect to superimposed direct currents Idc and FIG. 13(b) is a graph that represents results of measurement of frequency characteristics for equivalent series inductance ESL of the inductor whose equivalent circuit model is illustrated in FIG. 12 with respect to superimposed direct currents Idc.

FIG. 13(a) is a graph that represents results of measurement of frequency characteristics for equivalent series resistance ESR of the above-described sample inductor with respect to superimposed direct currents Idc in the frequency band of 100 kHz to 100 MHz. In this graph, the horizontal axis indicates the frequency (Hz), and the vertical axis indicates the value (ω) of the equivalent series resistance ESR. The scales of the axes are the powers of 10. For example, 1E+5 indicates $1 \times 10^5$ (=100000), "E" indicates the base 10, and +5 indicates the exponent. Similarly, 1E−1 indicates $1 \times 10^{-1}$ (=0.1). Frequency characteristics f0 indicated by the broken line are frequency characteristics when the superimposed direct current Idc is 0 mA. Frequency characteristics f1 indicated by the solid line are frequency characteristics when the superimposed direct current Idc is 400 mA. Frequency characteristics f2 indicated by the dot-and-dash line are frequency characteristics when the superimposed direct current Idc is 800 mA. Frequency characteristics f3 indicated by the dotted line are frequency characteristics when the superimposed direct current Idc is 1100 mA.

Figure 13B:
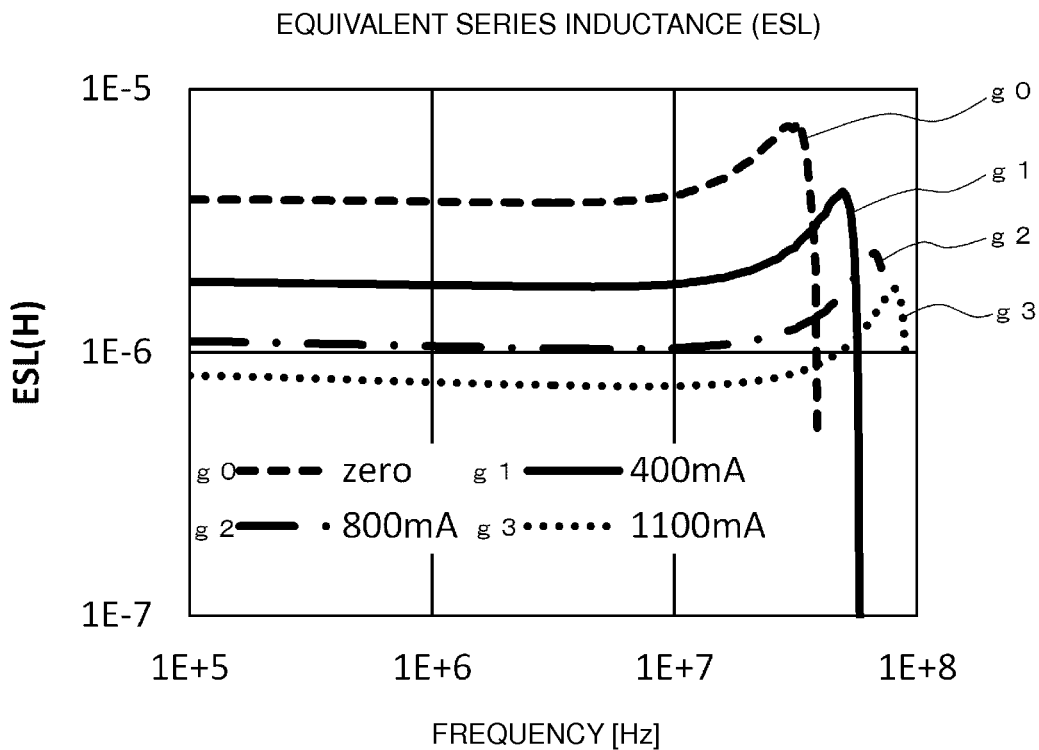

FIG. 13(b) is a graph that represents results of measurement of frequency characteristics for equivalent series inductance ESL of the above-described sample inductor with respect to the superimposed direct currents Idc in the same frequency band of 100 kHz to 100 MHz. In this graph, the horizontal axis indicates the frequency (Hz), and the vertical axis indicates the value (H) of the equivalent series inductance ESL. Frequency characteristics g0 indicated by the broken line are frequency characteristics when the superimposed direct current Idc is 0 mA. Frequency characteristics g1 indicated by the solid line are frequency characteristics when the superimposed direct current Idc is 400 mA. Frequency characteristics g2 indicated by the dot-and-dash line are frequency characteristics when the superimposed direct current Idc is 800 mA. Frequency characteristics g3 indicated by the dotted line are frequency characteristics when the superimposed direct current Idc is 1100 mA.

As illustrated in the graphs, both the equivalent series resistance ESR and the equivalent series inductance ESL reduce and vary with an increase in the superimposed direct current Idc.

Figure 14A:
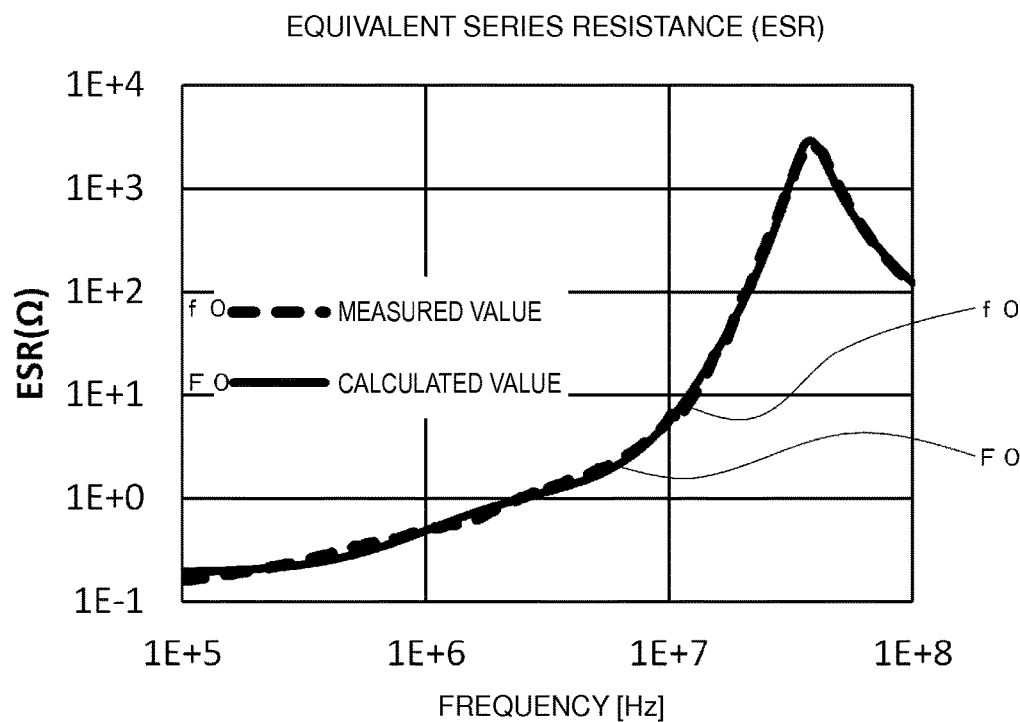
FIG. 14(a) is a graph that represents frequency characteristics for inductor equivalent series resistance ESR when no direct current is superimposed calculated by using the equivalent circuit model illustrated in FIG. 12 in comparison with measured frequency characteristics illustrated in FIG. 13(a) and FIG. 14(b) is a graph that represents frequency characteristics for inductor equivalent series inductance ESL when no direct current is superimposed calculated by using the equivalent circuit model illustrated in FIG. 12 in comparison with measured frequency characteristics illustrated in FIG. 13(b).

FIG. 14(a) is a graph that represents frequency characteristics for inductor equivalent series resistance ESR of the sample inductor when the direct current Idc is not superimposed calculated by using the equivalent circuit model illustrated in FIG. 12 in comparison with measured frequency characteristics illustrated in FIG. 13(a). In this graph, the horizontal axis indicates the frequency (Hz), and the vertical axis indicates the value (ω) of the equivalent series resistance ESR. Frequency characteristics f0 indicated by the broken line are the above-described characteristics measured when the superimposed direct current Idc is 0 mA. Frequency characteristics F0 indicated by the solid line are characteristics when the superimposed direct current Idc is 0 mA calculated by using the equivalent circuit model illustrated in FIG. 12.

Figure 14B:
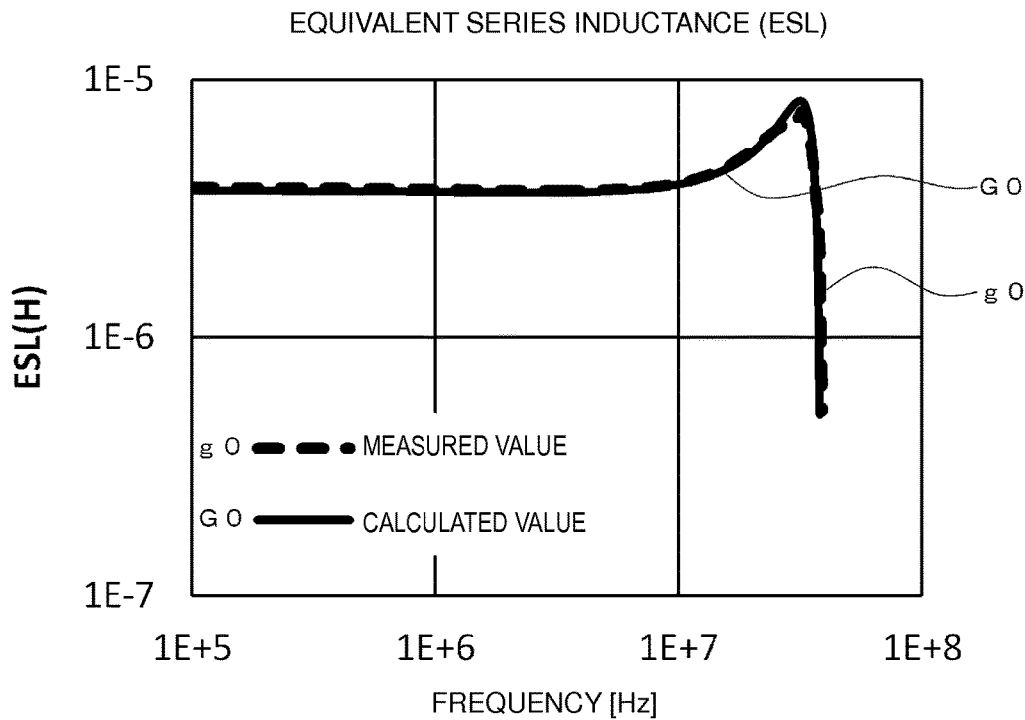
Figure 15A:
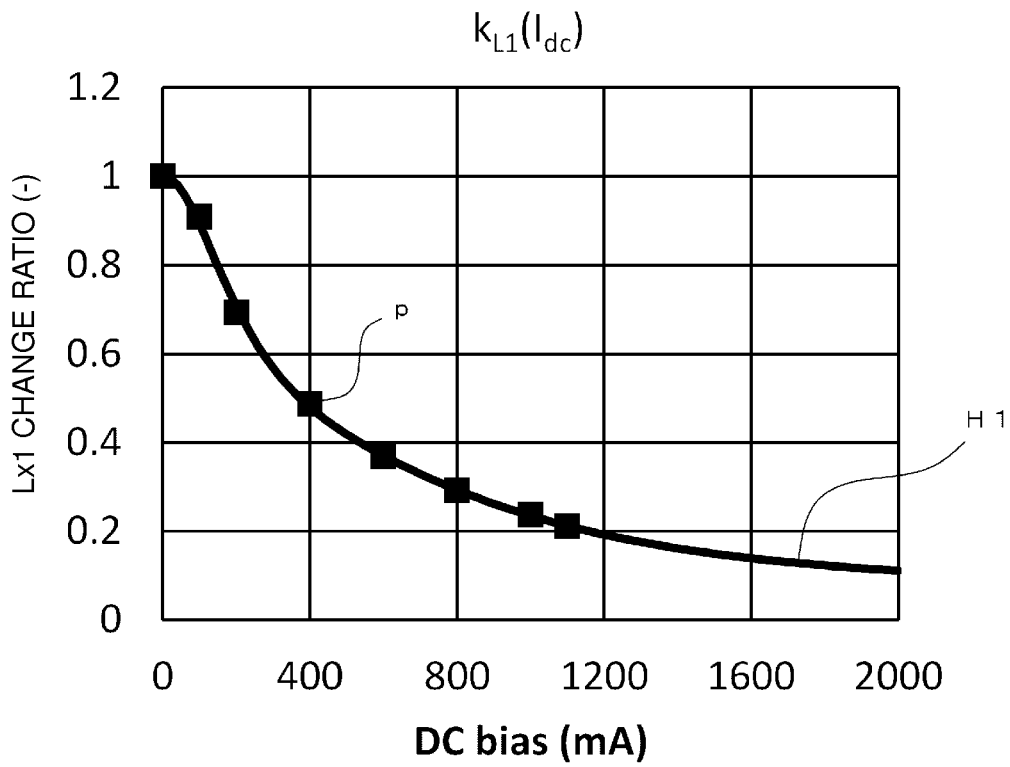
FIGS. 15(a) and 15(b) are graphs that represent characteristic change ratios $k_{L1}(Idc)$ and $K_{R1}(Idc)$ in the passive circuit elements $L_{X1}$ and $R_{X1}$ illustrated in FIG. 12, respectively.
Figure 15B:
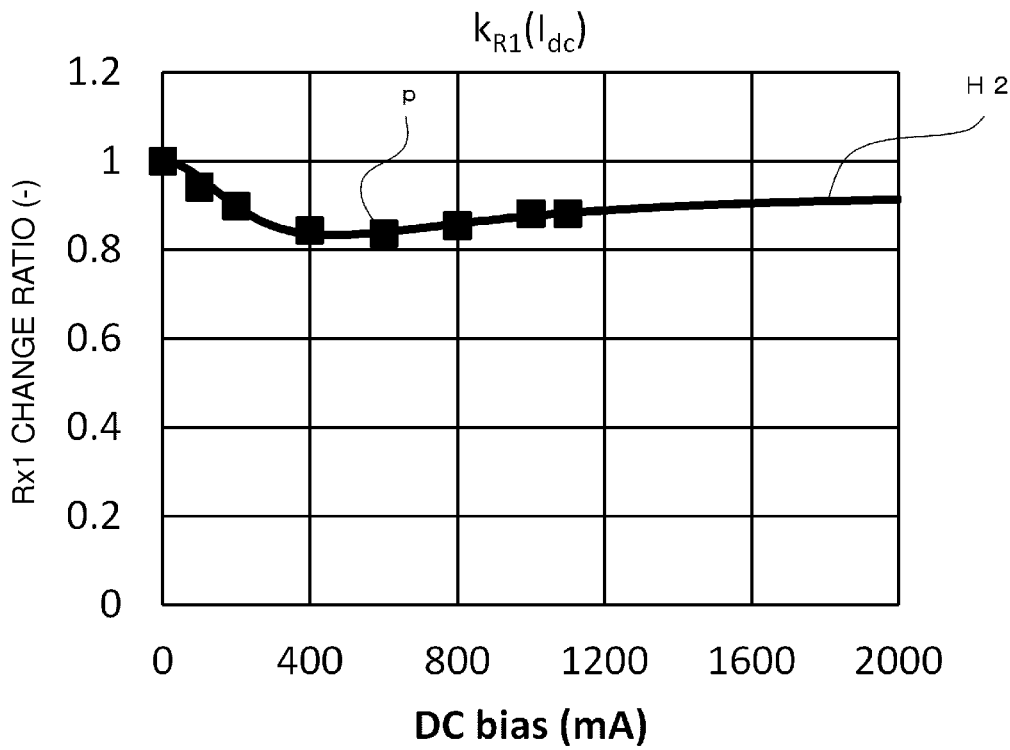
Figure 16A:
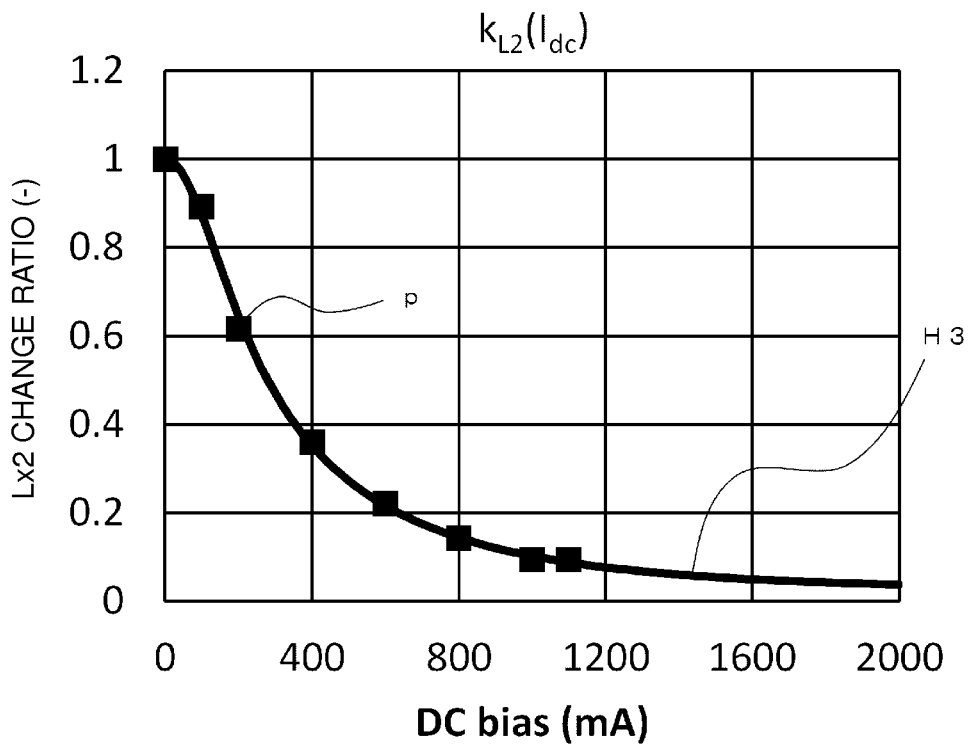
FIGS. 16(a) and 16(b) are graphs that represent characteristic change ratios $k_{L2}(Idc)$ and $K_{R2}(Idc)$ in the passive circuit elements $L_{X2}$ and $R_{X2}$ illustrated in FIG. 12, respectively.
Figure 16B:
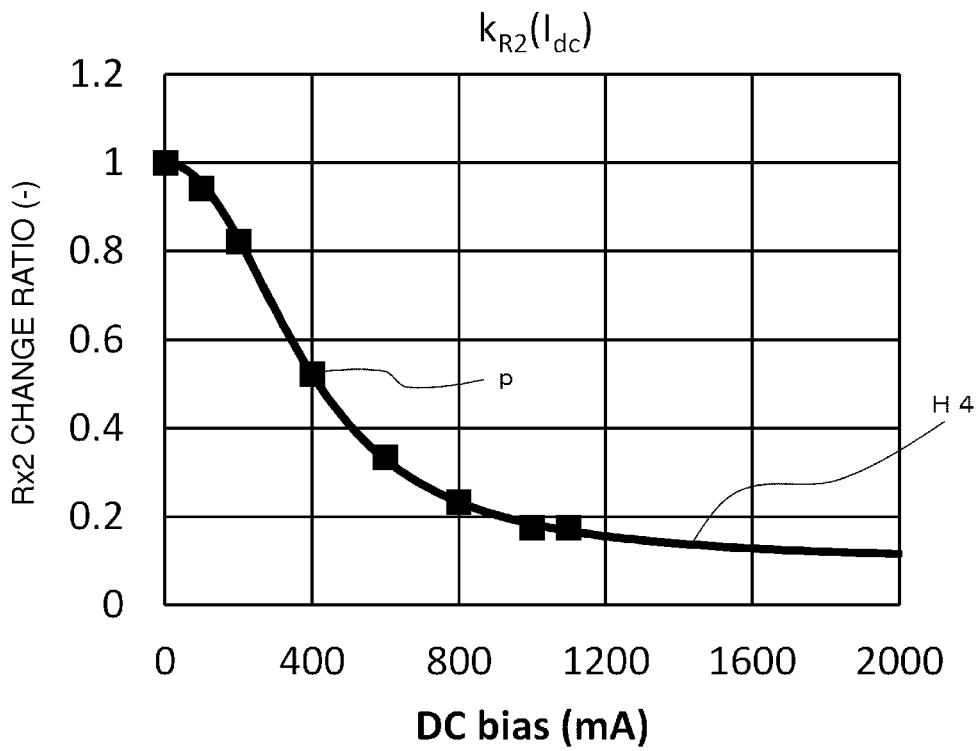

FIG. 14(b) is a graph that represents frequency characteristics for inductor equivalent series inductance ESL of the sample inductor when the direct current Idc is not superimposed calculated by using the equivalent circuit model illustrated in FIG. 12 in comparison with measured frequency characteristics illustrated in FIG. 13(b). In this graph, the horizontal axis indicates the frequency (Hz), and the vertical axis indicates the value (H) of the equivalent series inductance ESL. Frequency characteristics g0 indicated by the broken line are the above-described characteristics measured when the superimposed direct current Idc is 0 mA. Frequency characteristics G0 indicated by the solid line are characteristics when the superimposed direct current Idc is 0 mA calculated by using the equivalent circuit model illustrated in FIG. 12.

As illustrated in the graphs, the calculated values of both the equivalent series resistance ESR and the equivalent series inductance ESL obtained by using the equivalent circuit model illustrated in FIG. 12 closely coincide with the actually measured values.

FIGS. 15(a), 15(b), 16(a), and 16(b) are graphs that represent the characteristic change ratios $k_{L1}(Idc)$, $k_{R1}(Idc)$, $k_{L2}(Idc)$, and $k_{R2}(Idc)$ of the passive circuit elements $L_{X1}$, $R_{X1}$, $L_{X2}$, and $R_{X2}$ illustrated in FIG. 12. In each of the graphs, the horizontal axis indicates the direct current Idc superimposed on the sample inductor (DC bias) [mA], and the vertical axis indicates the characteristic change ratio. As previously explained, for the inductive elements $L_{X1}$ and $L_{X2}$, the characteristic change ratios are the ratios of the circuit constants $L_{X1}(Idc)$ and $L_{X2}(Idc)$ when the direct current is superimposed to the circuit constants L1 and L2 when no direct current is superimposed in the passive circuit elements $L_{X1}$ and $L_{X2}$, respectively, as indicated by Expression (11). For the resistive elements $R_{X1}$ and $R_{X2}$, the characteristic change ratios are the ratios of the circuit constants $R_{X1}(Idc)$ and $R_{X2}(Idc)$ when the direct current is superimposed to the circuit constants $R_1$ and $R_2$ when no direct current is superimposed in the passive circuit elements $R_{X1}$ and $R_{X2}$, respectively, as indicated by Expression (9).

The plots p of the square marks in each graph indicate measured values of the characteristic change ratio. The characteristic lines H1, H2, H3, and H4 connecting the plots p are expressed as the above-described approximate function exp(f(x)) derived based on those measured values.

Figure 17A:
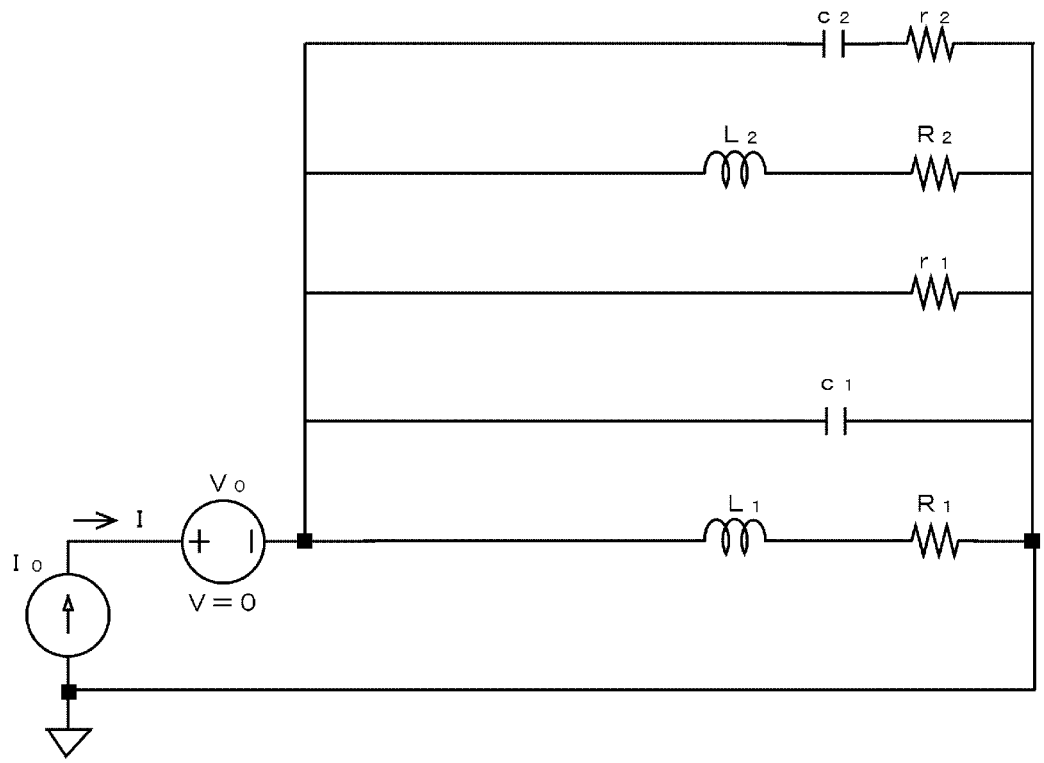
FIG. 17(a) is a circuit diagram that illustrates an inductor passive equivalent circuit model when no direct current is superimposed based on the equivalent circuit model illustrated in FIG. 12 in the fourth embodiment and FIG. 17(b) is a circuit diagram that illustrates an inductor nonlinear equivalent circuit model when the direct current is superimposed based on the same equivalent circuit model illustrated in FIG. 12 in the fourth embodiment.
Figure 17B:
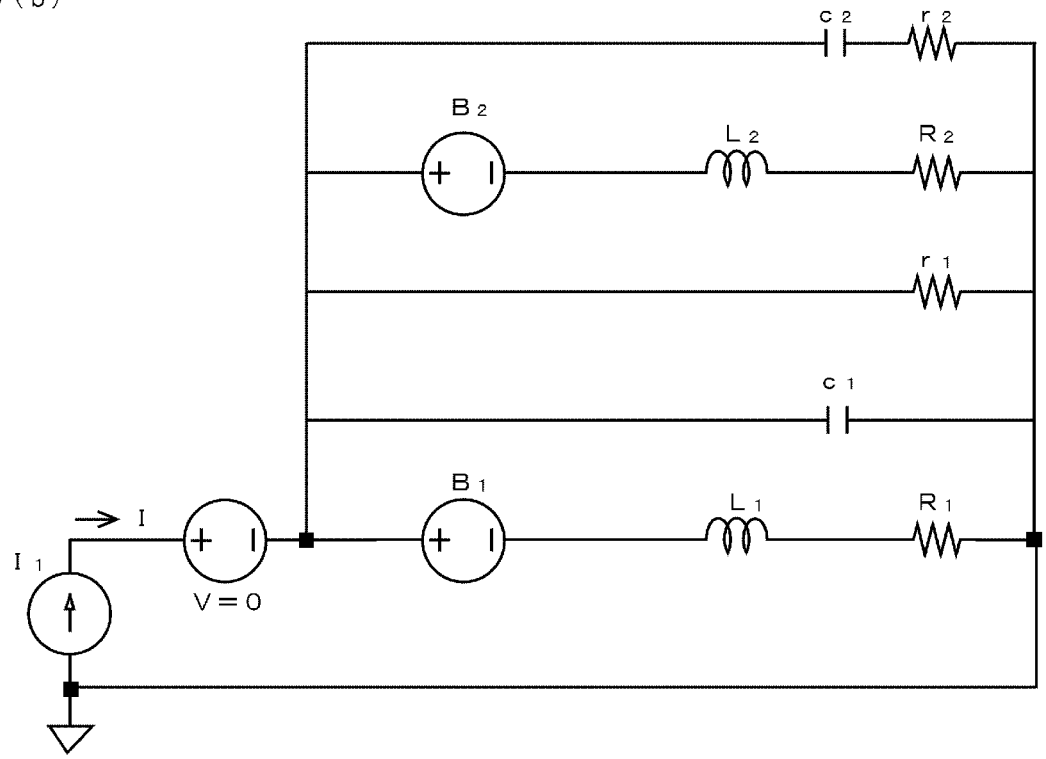

FIG. 17(a) is a circuit diagram that illustrates an inductor passive equivalent circuit model when no direct current is superimposed based on the equivalent circuit model illustrated in FIG. 12 in the fourth embodiment. FIG. 17(b) is a circuit diagram that illustrates an inductor nonlinear equivalent circuit model when the direct current is superimposed based on the same equivalent circuit model illustrated in FIG. 12 in the fourth embodiment. In FIG. 17, the portions identical with or corresponding to those in FIGS. 5 and 12 have the same reference numerals, and the description thereof is omitted.

In the passive equivalent circuit model illustrated in FIG. 17(a) in the fourth embodiment, the resistive elements R and the inductive elements L represented as the circuit elements $R_{X1}$, $R_{X2}$, $L_{X1}$, and $L_{X2}$ in FIG. 12 are represented as the passive circuit elements $R_1$, $R_2$, $L_1$, and $L_2$ that can be handled as constants independent of the superimposed direct current Idc. In the nonlinear equivalent circuit model illustrated in FIG. 17(b), the circuit elements $R_{X1}$, $R_{X2}$, $L_{X1}$, and $L_{X2}$ in FIG. 12 are represented such that the series circuit of the above-described inductive element $L_1$ and resistive element $R_1$ is connected in series to the control voltage source $B_1$ and the series circuit of the above-described inductive element $L_2$ and resistive element $R_2$ is connected in series to the control voltage source $B_2$, which is similar to the control voltage source $B_1$. In the equivalent circuit models in the fourth embodiment, the series circuit of the control voltage source $B_1$ and the passive circuit elements $L_1$ and $R_1$ and the series circuit of the control voltage source $B_2$ and the passive circuit elements $L_2$ and $R_2$ are connected in parallel, as in the equivalent circuit models illustrated in FIGS. 5(a) and 5(b) in the second embodiment. The equivalent circuit models in FIGS. 17(a) and 17(b) include the passive circuit elements $r_1$, $c_1$, $r_2$, and $c_2$, whose characteristics are not changed by the superimposition of the direct current Idc to the inductor, as in the equivalent circuit model illustrated in FIG. 9 in the third embodiment.

In the fourth embodiment, in the passive equivalent circuit model illustrated in FIG. 17(a), the alternating current Iac on which the direct current Idc is not superimposed is flowed to the circuit as the current I by the current source model $I_0$. In the nonlinear equivalent circuit model illustrated in FIG. 17(b), the alternating current Iac on which the direct current Idc is superimposed is flowed to the circuit as the current I by the current source model $I_1$.

In simulation of the inductor using the equivalent circuit models illustrated in FIG. 17, first, the characteristic change ratios $k_{L1}(Idc)$ $k_{R1}(Idc)$, $k_{L2}(Idc)$ and $k_{R2}(Idc)$ are calculated by using the approximate function exp(f(x)) representing the characteristic lines H1, H2, H3, and H4 illustrated in FIGS. 15(a), 15(b), 16(a) and 16(b) in accordance with the reference current Iref. Then, the control voltage source $B_1$ generates the difference voltages $\Delta V_{L1}(Idc)$ and $\Delta V_{R1}(Idc)$ between the voltages $V_{L1}(Idc)$ and $V_{R1}(Idc)$ occurring when the direct current is superimposed and the voltages $V_{L1}$ and $V_{R1}$ occurring when no direct current is superimposed on the basis of the calculated characteristic change ratios $k_{L1}(Idc)$ and $k_{R1}(Idc)$ of the passive circuit elements $L_1$ and $R_1$ and the voltages $V_{L1}$ and $V_{R1}$ occurring when no direct current is superimposed in substantially the same manner as the simulation method in the first embodiment. The control voltage source $B_2$ generates the difference voltages $\Delta V_{L2}(Idc)$ and $\Delta V_{R2}(Idc)$ between the voltages $V_{L2}(Idc)$ and $V_{R2}(Idc)$ occurring when the direct current is superimposed and the voltages $V_{L2}$ and $V_{R2}$ occurring when no direct current is superimposed on the basis of the calculated characteristic change ratios $k_{L2}(Idc)$ and $k_{R2}(Idc)$ of the passive circuit elements L2 and R2 and the voltages $V_{L2}$ and $V_{R2}$ occurring when no direct current is superimposed in substantially the same manner as the control voltage source $B_1$.

Figure 18A:
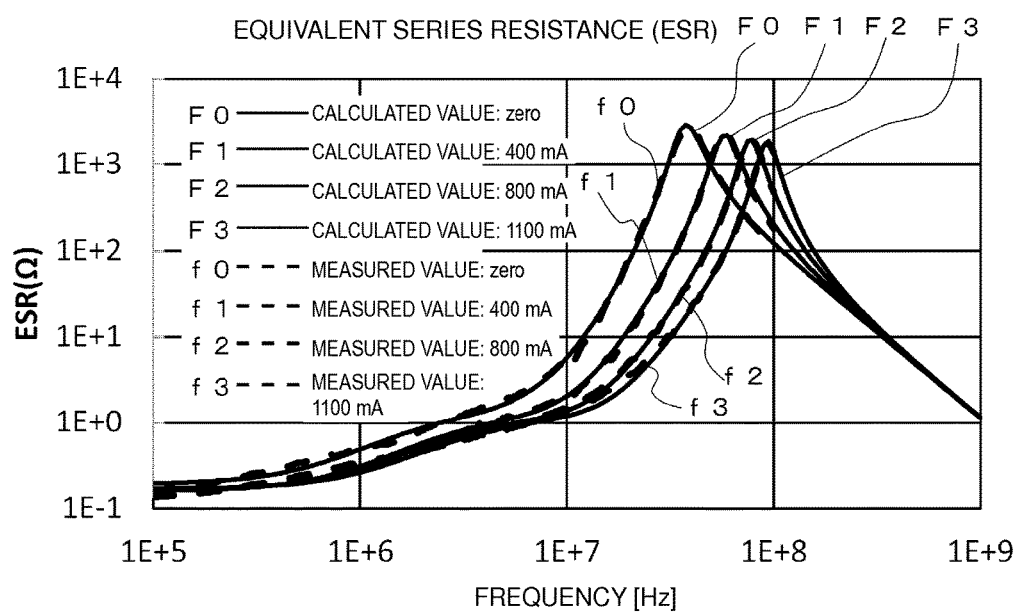
FIG. 18(a) is a graph that represents frequency characteristics for inductor equivalent series resistance ESR when the direct currents Idc are superimposed and when no direct currents are superimposed calculated by using the equivalent circuit models illustrated in FIG. 17 in comparison with measured frequency characteristics illustrated in FIG. 13(a) and FIG. 18(b) is a graph that represents frequency characteristics for inductor equivalent series inductance ESL when the direct currents Idc are superimposed and when no direct currents are superimposed calculated by using the equivalent circuit models illustrated in FIG. 17 in comparison with measured frequency characteristics illustrated in FIG. 13(b).

FIG. 18(a) is a graph that represents frequency characteristics for equivalent series resistance ESR of the sample inductor when the direct current Idc is superimposed and when it is not superimposed calculated by using the equivalent circuit models illustrated in FIGS. 17(a) and 17(b) in comparison with measured frequency characteristics illustrated in FIG. 13(a). In this graph, the horizontal axis indicates the frequency (Hz), and the vertical axis indicates the value ($\omega$) of the equivalent series resistance ESR.

Frequency characteristics f0, f1, f2, and f3 indicated by the broken lines are the above-described characteristics illustrated in FIG. 13(a) and measured when the superimposed direct current Idc is 0, 400, 800, and 1100 mA, respectively. Frequency characteristics F0 indicated by the solid line are characteristics calculated when the superimposed direct current Idc is 0 mA by using the nonlinear equivalent circuit model illustrated in FIG. 17(b), and frequency characteristics F1, F2, and F3 indicated by the solid lines are characteristics calculated when the superimposed direct current Idc is 400, 800, and 1100 mA, respectively. The frequency band for measurement of the frequency characteristics f0 to f3 illustrated in FIG. 13(a) are 100 kHz to 100 MHz, as previously described, whereas the frequency band for calculation in this simulation is 100 kHz to 1000 MHz.

Figure 18B:
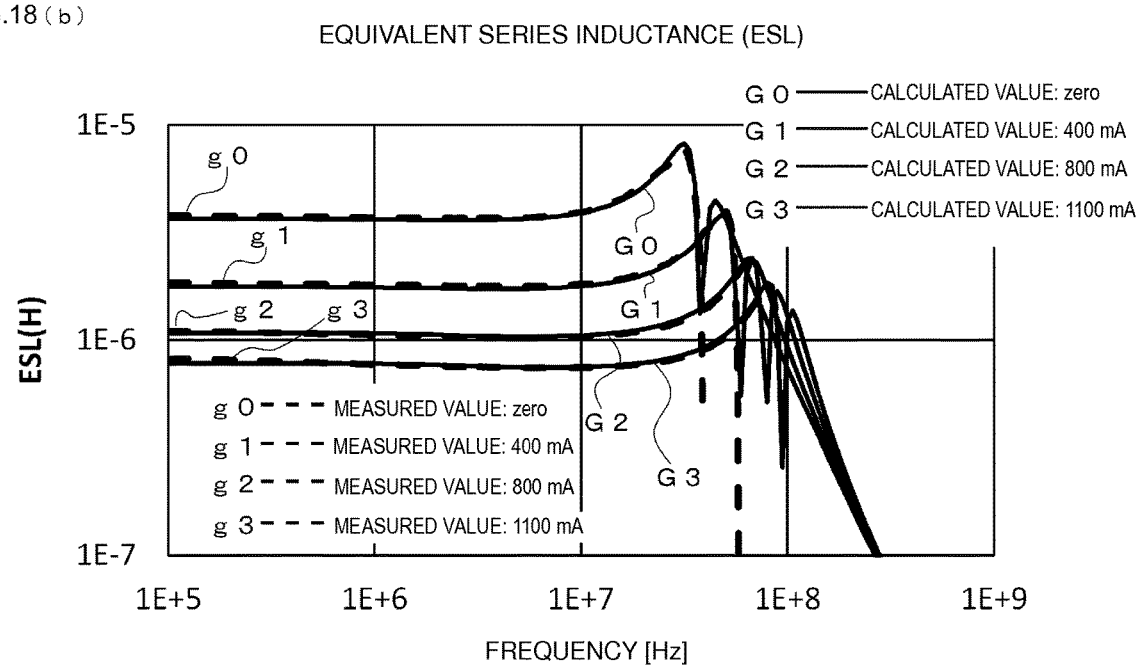

FIG. 18(b) is a graph that represents frequency characteristics for equivalent series inductance ESL of the sample inductor when the direct currents Idc are superimposed and when no direct currents are superimposed calculated by using the equivalent circuit models illustrated in FIG. 17 in comparison with measured frequency characteristics illustrated in FIG. 13(b). In this graph, the horizontal axis indicates the frequency (Hz), and the vertical axis indicates the value (H) of the equivalent series inductance ESL.

Frequency characteristics g0, g1, g2, and g3 indicated by the broken lines are the above-described characteristics illustrated in FIG. 13(b) and measured when the superimposed direct current Idc is 0, 400, 800, and 1100 mA, respectively. Frequency characteristics G0 indicated by the solid line are characteristics calculated when the superimposed direct current Idc is 0 mA by using the nonlinear equivalent circuit model illustrated in FIG. 17(b), and frequency characteristics G1, G2, and G3 indicated by the solid lines are characteristics calculated when the superimposed direct current Idc is 400, 800, and 1100 mA, respectively. The frequency band for measurement of the frequency characteristics g0 to g3 illustrated in FIG. 13(b) are 100 kHz to 100 MHz, as previously described, whereas the frequency band for calculation in this simulation is also 100 kHz to 1000 MHz.

As illustrated in the graphs, the calculated values of both the equivalent series resistance ESR and the equivalent series inductance ESL obtained by using the equivalent circuit model illustrated in FIGS. 17(a) and 17(b) closely coincide with the actually measured values.

Figure 19A:
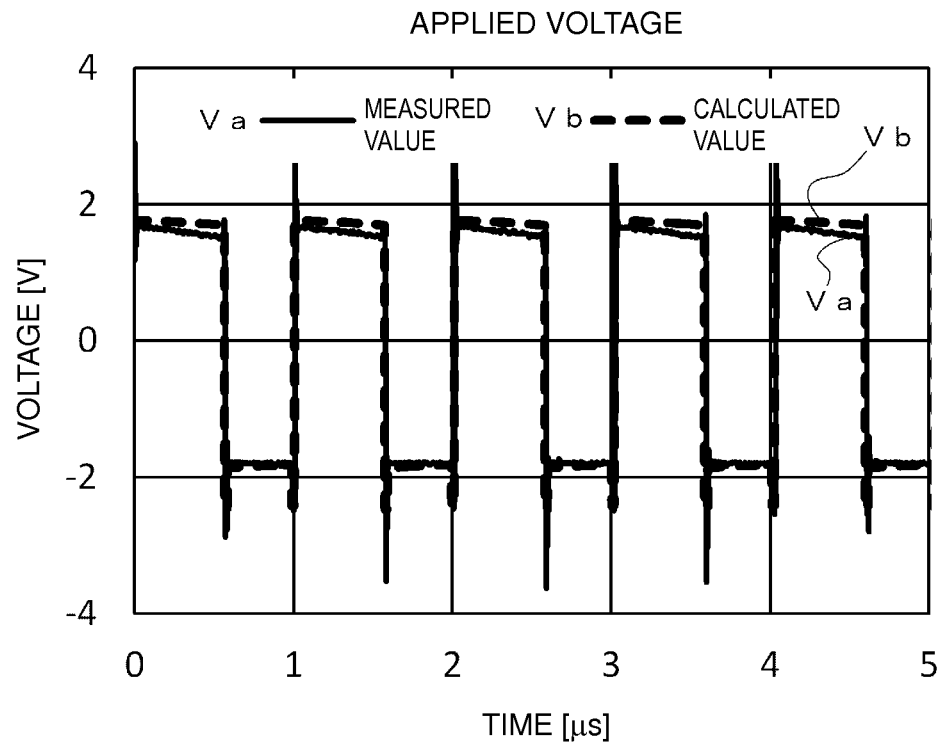
FIGS. 19(a) and (b) include graphs that represent transient response characteristics for a current with respect to an applied voltage for the inductor whose equivalent circuit models are illustrated in FIG. 17.
Figure 19B:
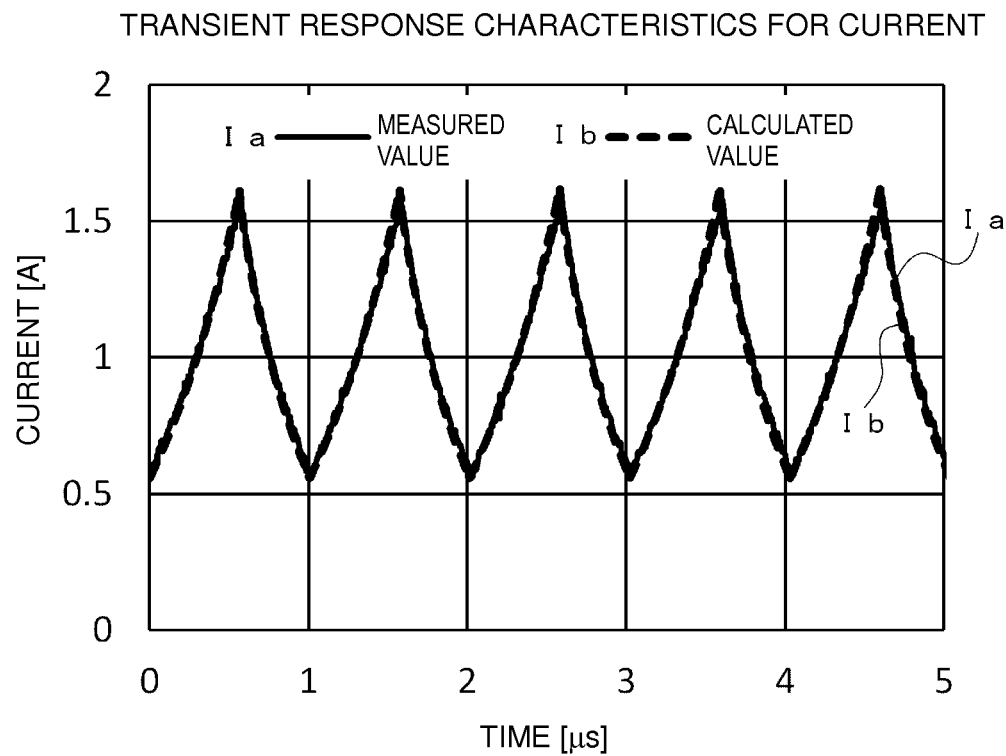

FIGS. 19(a) and 19(b) include graphs that represent transient response characteristics for a current with respect to an applied voltage for the sample inductor whose equivalent circuit models are illustrated in FIGS. 17(a) and 17(b).

The graph in FIG. 19(a) illustrates waveforms of a voltage that is output from a switching regulator IC (highly integrated circuit) and that is applied to the sample inductor. In this graph, the horizontal axis indicates the time (μs), and the vertical axis indicates the voltage (V). A voltage waveform Va indicated by the solid line is the waveform obtained from the measured values. A voltage waveform Vb indicated by the broken line is the waveform obtained from calculated values acquired by using a device model supplied from a manufacturer that produced the used switching regulator IC.

The graph in FIG. 19(b) illustrates current waveforms that represents transient response characteristics for a current that is flowed in the sample inductor by the application of the voltage illustrated in FIG. 19(a). In this graph, the horizontal axis indicates the time (μs), and the vertical axis indicates the current (A). A current waveform Ia indicated by the solid line is the waveform obtained from the measured values. A current waveform Ib indicated by the broken line is the waveform obtained from calculated values acquired by using the equivalent circuit models for the sample inductor illustrated in FIGS. 17(a) and 17(b).

As illustrated in the graph in FIG. 19(b), the calculated values of the transient response characteristics obtained by using the equivalent circuit models for the sample inductor illustrated in FIGS. 17(a) and 17(b) closely coincide with the actually measured values.

That is, with the simulation using the equivalent circuit models for the sample inductor illustrated in FIGS. 17(a) and 17(b) in the fourth embodiment, the characteristics of the sample inductor varying in accordance with the superimposed direct current Idc can be reproduced and simulated in a wide range and with high precision. Thus, substantially the same operational advantages as in the first to third embodiments are also obtainable.

In the above-described embodiments, the cases where the equivalent circuit models are applied to LTspice supplied from Linear Technology Corporation are described. Circuit simulators to which the equivalent circuit models are applicable are not limited to LTspice. For example, they are also applicable to other circuit simulators, such as Microwave Office supplied from Applied Wave Research Corporation (AWR Corporation) and ADS supplied from Agilent Technologies Inc. Corporation (Agilent Corporation).

INDUSTRIAL APPLICABILITY

The inductor simulation method and inductor nonlinear equivalent circuit model in the above-described embodiments can be easily used by employing a computer program described below. The computer program includes first, second, and third steps. In the first step, the type of an inductor used in electronic circuit design is input. In the second step, a voltage V to be applied to the inductor or a current I to be flowed to the inductor is input. In the third step, the current I flowed in the inductor by the voltage V or the current I input in the second step is measured, and a reference current Iref is referred to. Then, control voltage sources Bx generate difference voltages $\Delta V_{RX}(Iref)$, $\Delta V_{CX}(Iref)$, and $\Delta V_{LX}(Iref)$ in accordance with the reference current Iref on the basis of characteristic change ratios $k_{RX}(Iref)$, $k_{CX}(Iref)$, and $k_{LX}(Iref)$ calculated in accordance with the reference current Iref by using an approximate function $\exp(f(x))$ prepared in advance for the inductor of the type input in the first step and voltages $V_{RX}$, $V_{CX}$, and $V_{LX}$ occurring when no direct current is superimposed, they are superimposed on the voltages $V_{RX}$, $V_{CX}$, and $V_{LX}$ occurring when no direct current is superimposed, and thus the nonlinear characteristics of the inductor when the direct current is superimposed are simulated. The computer program implements the inductor simulation method in the above-described embodiments or enables the inductor nonlinear equivalent circuit model in the above-described embodiments to function by computation processing of performing the above steps.

With the present configuration, in response to the inputting of the type of the inductor to be simulated and the values of the voltage V to be applied to the inductor or the current I to be flowed to the inductor into the computer program, the computer program superimposes the difference voltages $\Delta V_{RX}(Iref)$, $\Delta V_{CX}(Iref)$, and $\Delta V_{LX}(Iref)$ on the voltages $V_{RX}$, $V_{CX}$, and $V_{LX}$ occurring when no direct current is superimposed in the passive circuit elements Rx, Cx, and Lx and automatically performs simulation of the nonlinear characteristics of the inductor of the input type. Thus, a user can perform accurate circuit simulation with high precision easily by simply inputting the type of the inductor to be simulated and the voltage V to be applied to the inductor or the current I to be flowed to the inductor into the computer program. Accordingly, even an ordinary user who does not have expert knowledge of circuit simulation can perform accurate circuit simulation for an electronic circuit using the inductor with high precision easily.

The above-described computer program allows a user to use it from a terminal, such as a personal computer, connected to the Internet network by accessing a server of an electronic component manufacturer having the above-described computer program over the Internet network. The present configuration enables the user to readily use the above-described computer program by accessing the server having the above-described computer program from the terminal connected to the Internet network. Thus, the inductor simulation method and inductor nonlinear equivalent circuit model in the above-described embodiments can be provided to many users.

The invention claimed is:

1. An inductor simulation method for simulating nonlinear characteristics of an inductor, comprising:
   representing an equivalent circuit of the inductor by using a passive circuit element;
   expressing a characteristic change ratio of the passive circuit element when a direct current is superimposed as an approximate function that uses current as a variable, based on actually measured values; and
   referring to the direct current flowing in the inductor, generating, using a computer, a difference voltage between a voltage occurring in the passive circuit element when a direct current is superimposed and a voltage occurring in the passive circuit element when no direct current is superimposed, based on the characteristic change ratio calculated in accordance with the referred current by using the approximate function and based on the voltage occurring when no direct current is superimposed, by using a control voltage source connected in series to the passive circuit element whose characteristics are changed by the superimposition of a direct current, and superimposes the difference voltage on the voltage occurring when no direct current is superimposed, thereby simulating the nonlinear characteristics of the inductor when the direct current is superimposed.

2. A computer program product, comprising:
   a non-transitory computer-readable memory that includes an inductor nonlinear equivalent circuit model program that, when accessed by a computer, causes the computer to:
   represent, using a passive circuit element, an equivalent circuit of an inductor;
   refer to, using a current referring element, a current flowing in the inductor; and
   generate, using a control voltage source, a difference voltage between a voltage occurring in the passive circuit element when a direct current is superimposed and a voltage occurring in the passive circuit element when no direct current is superimposed, based on a characteristic change ratio of the passive circuit element when a direct current is superimposed which is calculated in accordance with the current referred to by the current referring element and by using an approximate function expressed with current as a variable from actually measured values, and based on the voltage occurring when no direct current is superimposed, the control voltage source being connected in series to the passive circuit element whose characteristics are changed by the superimposition of a direct current, and superimposes the difference voltage on the voltage occurring when no direct current is superimposed, thereby simulating the nonlinear characteristics of the inductor when the direct current is superimposed.

3. The inductor simulation method of claim 1, wherein the difference voltage is given as a function form of the following expression:

$$\Delta V = V0 \times (\exp(f(x))-1)$$

where the difference voltage is $\Delta V$, the voltage occurring when no direct current is superimposed is $V0$, and the approximate function is the function $\exp(f(x))$ using the referred current x as a variable.

4. An inductor simulation method for simulating nonlinear characteristics of an inductor, comprising:
   representing an equivalent circuit of the inductor by using a passive circuit element;
   expressing a characteristic change ratio of the passive circuit element when a direct current is superimposed as an approximate function that uses current as a variable, based on actually measured values; and
   referring to the direct current flowing in the inductor, generating, using a computer, a difference voltage between a voltage occurring in the passive circuit element when a direct current is superimposed and a voltage occurring in the passive circuit element when no direct current is superimposed, based on the characteristic change ratio calculated in accordance with the referred current by using the approximate function and based on the voltage occurring when no direct current is superimposed, by using a control voltage source connected in series to the passive circuit element whose characteristics are changed by the superimposition of a direct current, and superimposes the difference voltage on the voltage occurring when no direct current is superimposed, thereby simulating the nonlinear characteristics of the inductor when the direct current is superimposed; wherein
   the approximate function is given by an even function in a polynomial form that includes no odd number exponents.

5. The inductor simulation method of claim 1, wherein the direct current flowing in the inductor is referred to at an input terminal or at an output terminal of the equivalent circuit, and the voltage occurring when no direct current is superimposed is referred to at both terminals of the passive circuit element.

6. The inductor simulation method of claim 1, wherein the passive circuit element connected in series to the control voltage source is a single inductive element, or a series circuit of an inductive element and a resistive element, or a series circuit of an inductive element, a resistive element, and a capacitive element.

7. The inductor simulation method of claim 1, wherein a plurality of series circuits, each constituted by the control voltage source and the passive circuit element, form a parallel circuit.

8. The inductor simulation method of claim 1, wherein the equivalent circuit includes the passive circuit element whose characteristics are not changed by the superimposition of a direct current.

9. An inductor simulation method for simulating nonlinear characteristics of an inductor when a direct current is superimposed, comprising: using the inductor nonlinear equivalent circuit model of claim 2.

10. A non-transitory computer-readable memory containing a computer program for implementing the inductor simulation method of claim 1, the computer program comprising:
   a first step of inputting, using a computer, a type of the inductor;
   a second step of inputting, using the computer, a voltage to be applied to the inductor or a current to be flowed to the inductor; and
   a third step of making, using the computer, reference to the current flowing in the inductor in accordance with the voltage or the current input in the second step, generating the difference voltage by the control voltage source, based on the characteristic change ratio calculated by using the approximate function prepared in advance for the inductor of the type input in the first step in accordance with the referred current and based on the voltage occurring when no direct current is superimposed, superimposing the difference voltage on the voltage occurring when no direct current is superimposed, thereby simulating the nonlinear characteristics of the inductor when the direct current is superimposed.

11. A method of using the computer program of claim 10 by accessing a server having the computer program over the Internet network and using the computer program from a terminal connected to the Internet network.

12. The computer program product of claim 2, wherein the difference voltage is given as a function form of the following expression:

$$\Delta V = V0 \times (\exp(f(x)) - 1)$$

where the difference voltage is $\Delta V$, the voltage occurring when no direct current is superimposed is V0, and the approximate function is the function $\exp(f(x))$ using the referred current x as a variable.

13. The computer program product of claim 2, wherein the approximate function is given by an even function in a polynomial form that includes no odd number exponents.

14. The computer program product of claim 2, wherein the current flowing in the inductor is referred to at an input terminal or at an output terminal of the equivalent circuit, and the voltage occurring when no direct current is superimposed is referred to at both terminals of the passive circuit element.

15. The computer program product of claim 2, wherein the passive circuit element connected in series to the control voltage source is a single inductive element, or a series circuit of an inductive element and a resistive element, or a series circuit of an inductive element, a resistive element, and a capacitive element.

16. The computer program product of claim 2, wherein a plurality of series circuits, each constituted by the control voltage source and the passive circuit element, form a parallel circuit.

17. The computer program product of claim 2, wherein the equivalent circuit includes the passive circuit element whose characteristics are not changed by the superimposition of a direct current.

* * * * *